United States Patent
Ha et al.

(10) Patent No.: US 12,328,967 B2
(45) Date of Patent: Jun. 10, 2025

(54) SOLAR CELL AND SOLAR CELL PANEL INCLUDING SAME

(71) Applicant: SHANGRAO XINYUAN YUEDONG TECHNOLOGY DEVELOPMENT CO. LTD, Jiangxi Province (CN)

(72) Inventors: Jungmin Ha, Seoul (KR); Juhwa Cheong, Seoul (KR); Youngsung Yang, Seoul (KR); Kyungdong Lee, Seoul (KR)

(73) Assignee: SHANGRAO XINYUAN YUEDONG TECHNOLOGY DEVELOPMENT CO. LTD, Jiangxi Province (CN)

( * ) Notice: Subject to any disclaimer, the term of this patent is extended or adjusted under 35 U.S.C. 154(b) by 352 days.

(21) Appl. No.: 17/615,167

(22) PCT Filed: Apr. 8, 2020

(86) PCT No.: PCT/KR2020/004767
§ 371 (c)(1),
(2) Date: Nov. 30, 2021

(87) PCT Pub. No.: WO2020/242043
PCT Pub. Date: Dec. 3, 2020

(65) Prior Publication Data
US 2022/0238731 A1    Jul. 28, 2022

(30) Foreign Application Priority Data
May 31, 2019    (KR) .......................... 10-2019-0064720

(51) Int. Cl.
*H10F 77/20*    (2025.01)
*H10F 10/14*    (2025.01)
(Continued)

(52) U.S. Cl.
CPC ......... *H10F 77/219* (2025.01); *H10F 10/146* (2025.01); *H10F 19/908* (2025.01);
(Continued)

(58) Field of Classification Search
CPC ......... H01L 31/048; H01L 31/05–0516; H01L 31/02008; H01L 31/022425;
(Continued)

(56) References Cited

U.S. PATENT DOCUMENTS

| | | | |
|---|---|---|---|
| 2013/0112253 A1* | 5/2013 | Oh | H01L 31/0682 136/255 |
| 2015/0114453 A1* | 4/2015 | Woo | H01L 31/05 136/251 |

(Continued)

FOREIGN PATENT DOCUMENTS

| | | |
|---|---|---|
| JP | 2012204528 | 10/2012 |
| JP | 2013058808 | 3/2013 |

(Continued)

OTHER PUBLICATIONS

European Search Report dated May 10, 2023 on European Patent Application No. EP20815083.9 Applicant Shangrao Jinko solar Technology Development Co., LTD.
International Search Report in International Appln. No. PCT/KR2020/004767, dated Nov. 25, 2020, 5 pages (with English translation).

*Primary Examiner* — Lindsey A Buck
(74) *Attorney, Agent, or Firm* — Tarolli, Sundheim, Covell & Tummino LLP

(57) ABSTRACT

The present disclosure relates to a solar cell and a solar cell panel including the same, and more particularly, to a solar cell with an improved structure and an improved manufacturing process and a solar cell panel including the same.

19 Claims, 16 Drawing Sheets

(51) Int. Cl.
*H10F 19/80* (2025.01)
*H10F 19/90* (2025.01)
*H10F 71/00* (2025.01)
*H10F 77/00* (2025.01)
*H10F 77/30* (2025.01)
*H10F 77/70* (2025.01)

(52) U.S. Cl.
CPC .......... *H10F 77/935* (2025.01); *H10F 19/80* (2025.01); *H10F 19/902* (2025.01); *H10F 71/00* (2025.01); *H10F 77/315* (2025.01); *H10F 77/703* (2025.01)

(58) Field of Classification Search
CPC .......... H01L 31/022441; H10F 77/935; H10F 77/219; H10F 19/908; H10F 10/146
See application file for complete search history.

(56) References Cited

U.S. PATENT DOCUMENTS

| | | | |
|---|---|---|---|
| 2015/0122323 A1* | 5/2015 | Khatri | ............ H01L 31/022425 |
| | | | 136/256 |
| 2016/0181454 A1* | 6/2016 | Son | ..................... H01L 31/0682 |
| | | | 438/66 |
| 2017/0069776 A1* | 3/2017 | Yang | ....................... H01L 31/18 |
| 2020/0185556 A1* | 6/2020 | Chang | ................. H01L 31/0468 |

FOREIGN PATENT DOCUMENTS

| | | |
|---|---|---|
| KR | 20150090708 | 8/2015 |
| KR | 20160025411 A | 3/2016 |
| KR | 101788169 | 11/2017 |
| KR | 101788169 B1 | 11/2017 |
| KR | 20190014882 | 2/2019 |

\* cited by examiner

[FIG. 1]
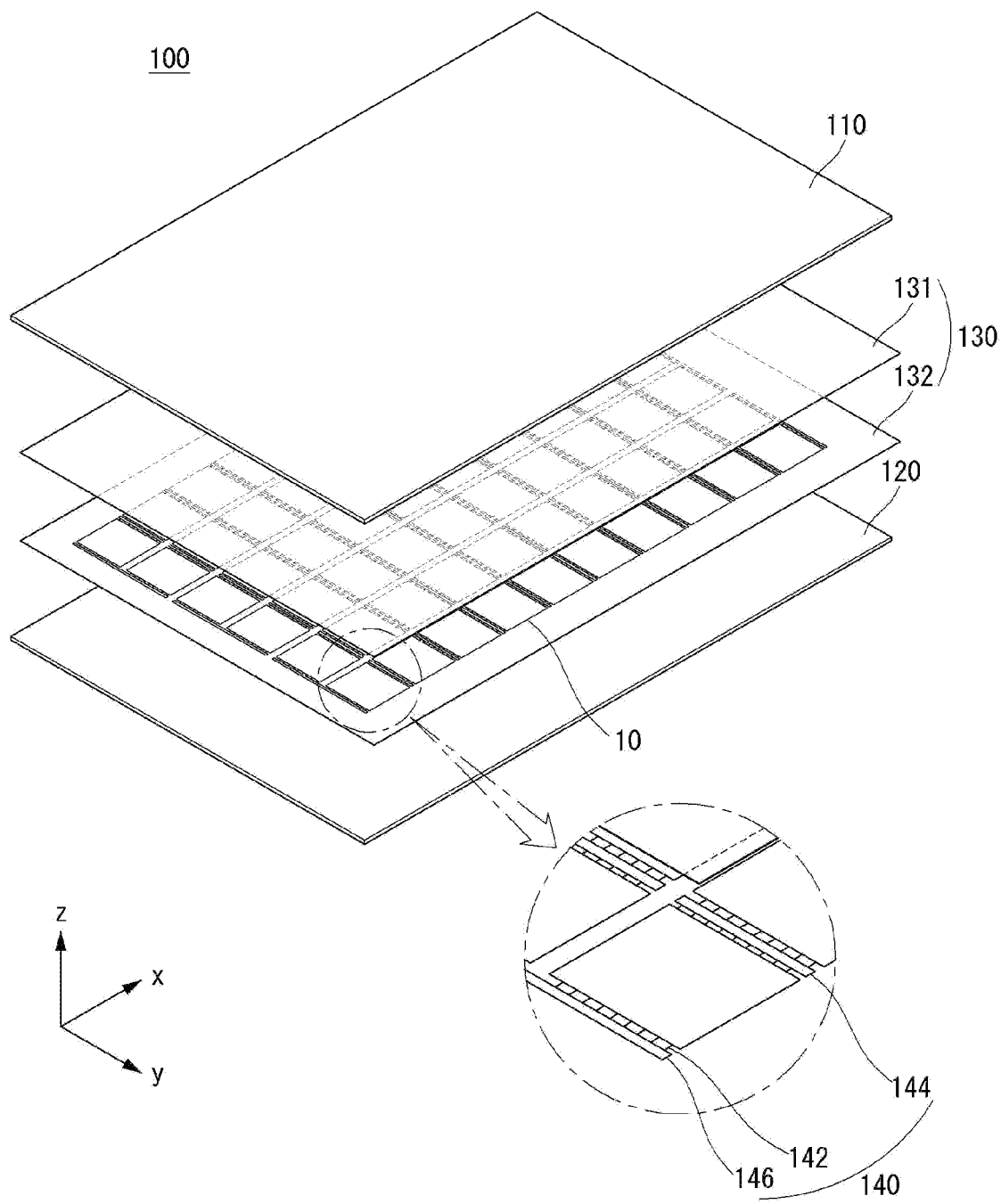

[FIG. 2]
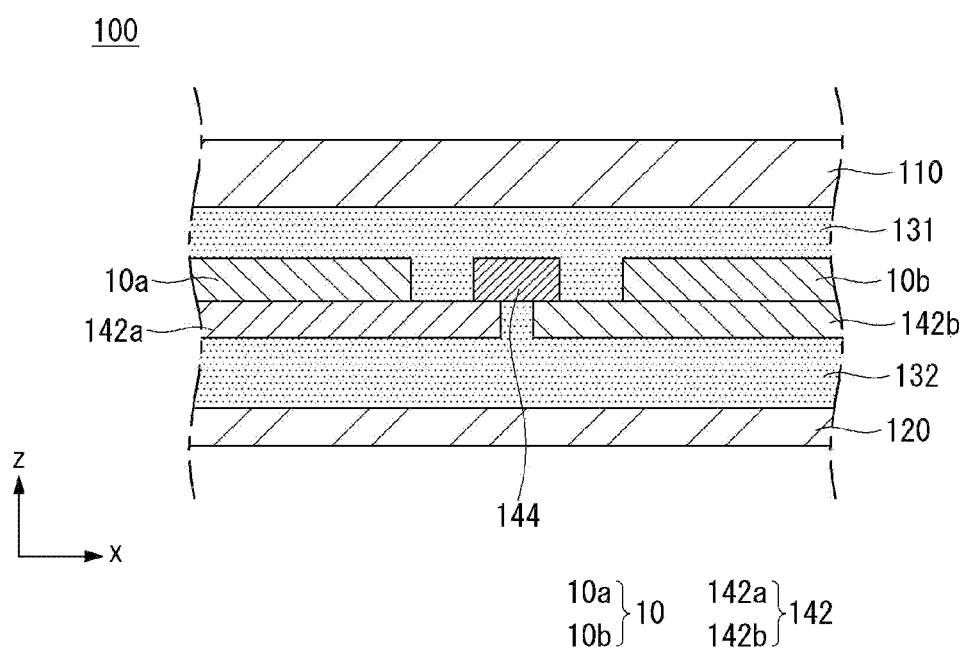

[FIG. 3]
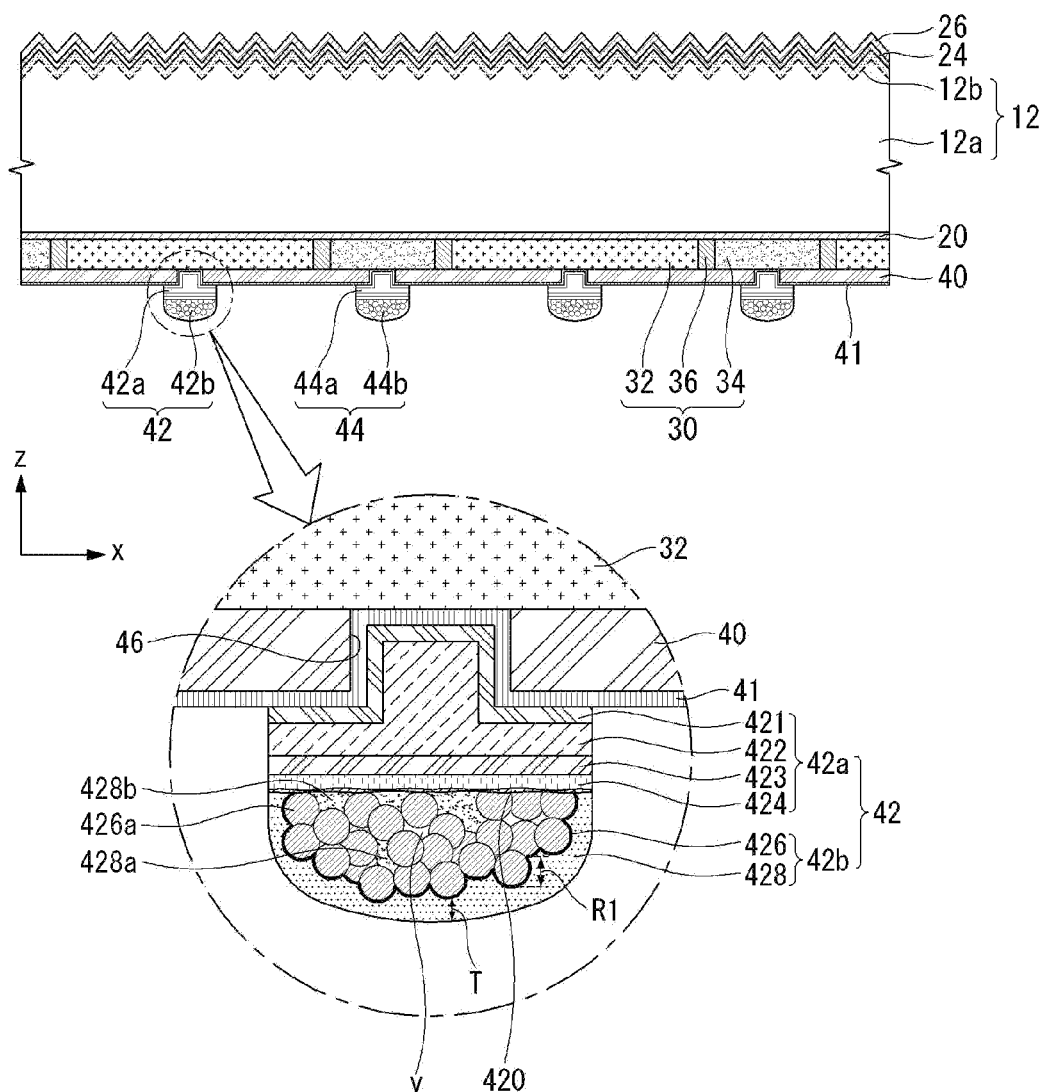

[FIG. 4]
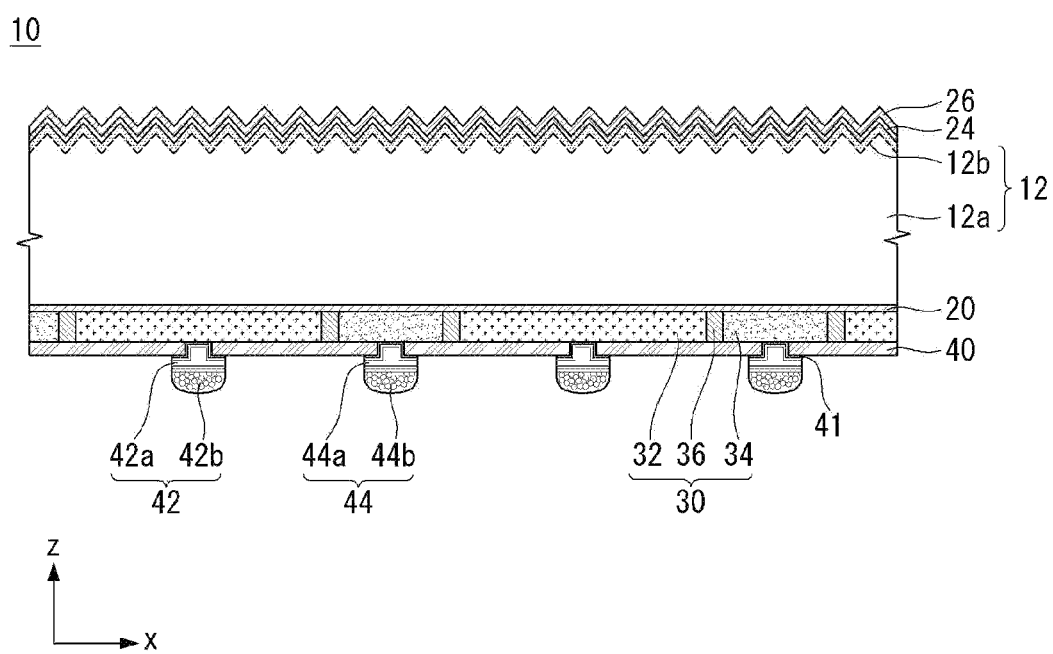

[FIG. 5]
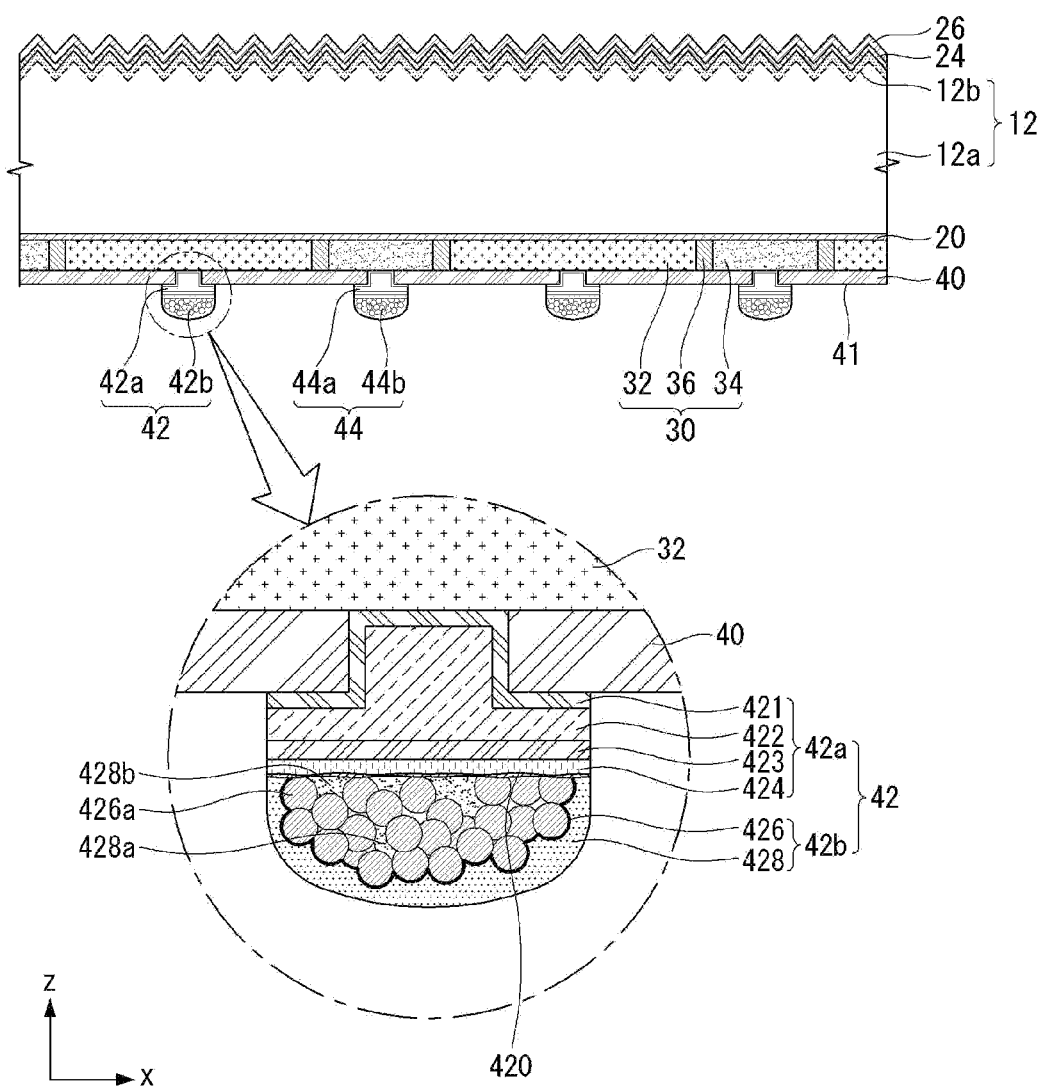

[FIG. 6]
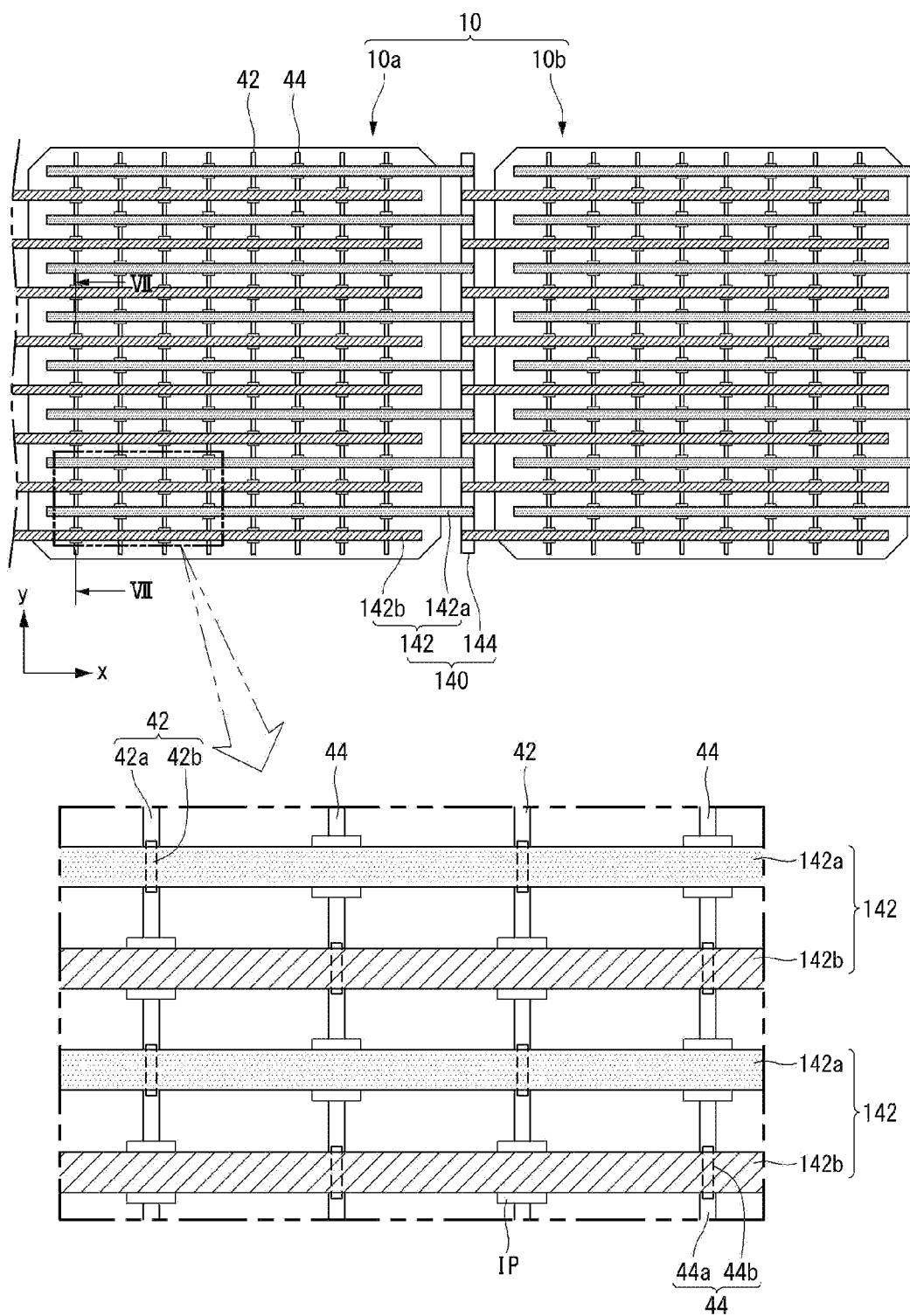

[FIG. 7]
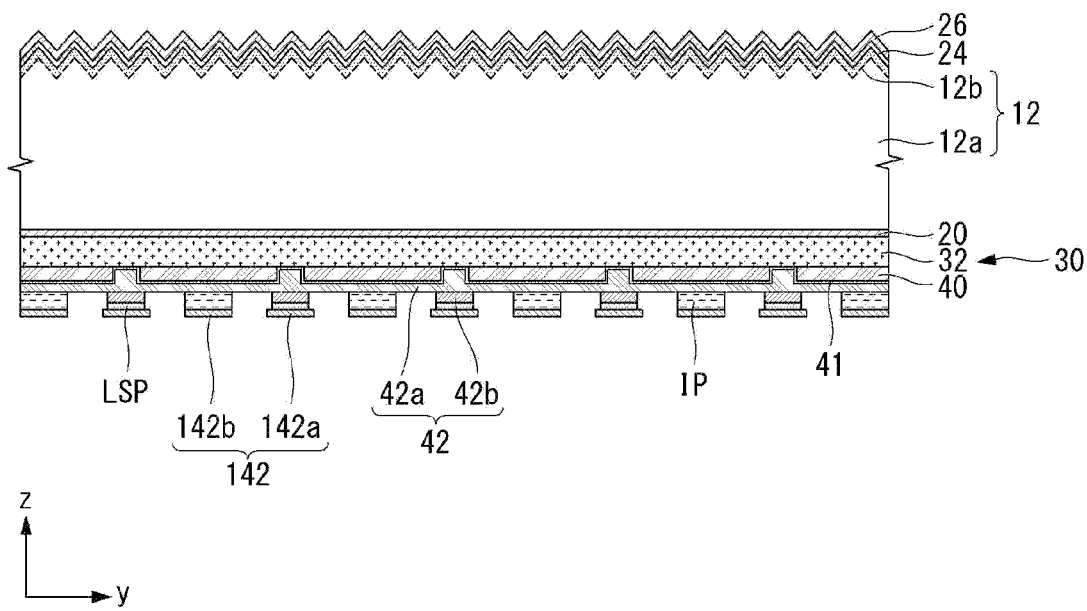
[FIG. 8]
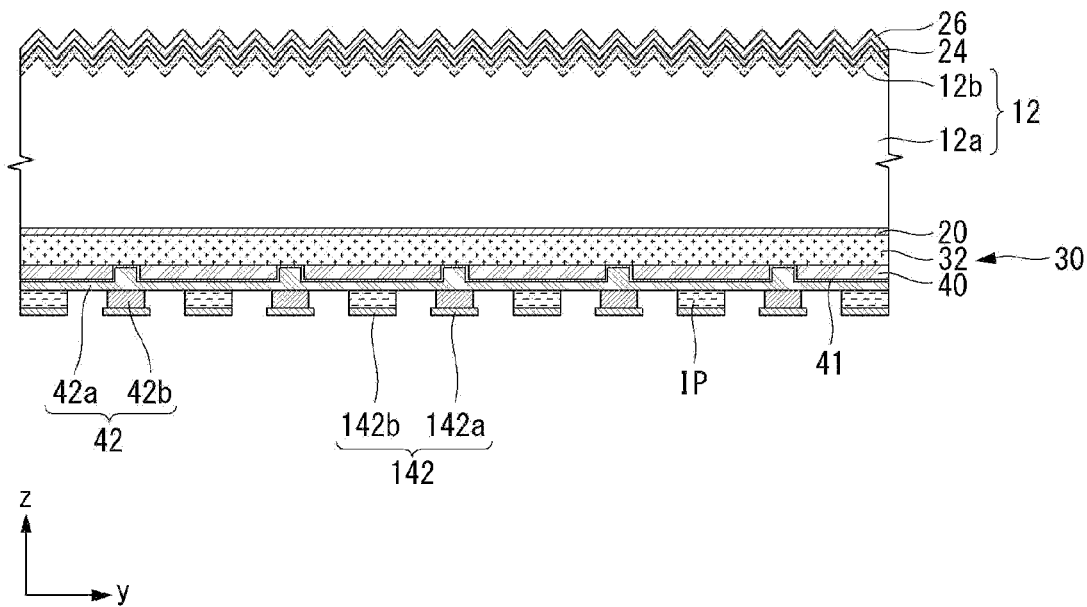

[FIG. 9a]
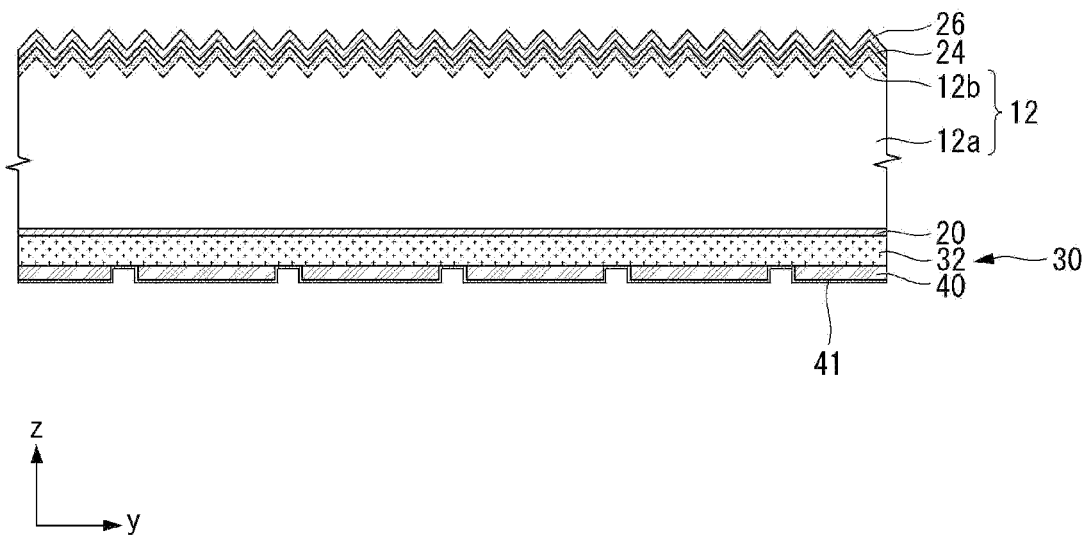
[FIG. 9b]
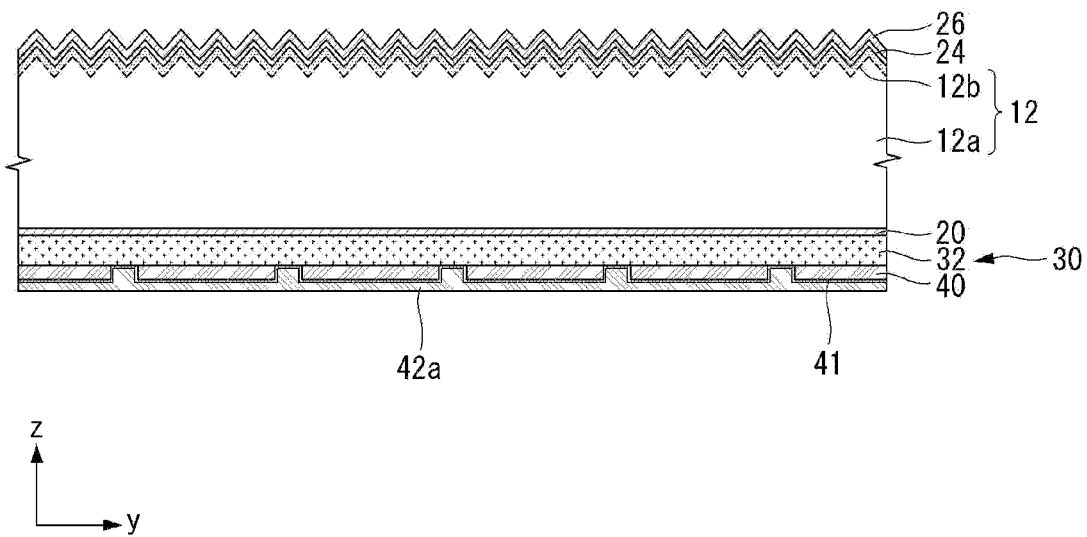

[FIG. 9c]
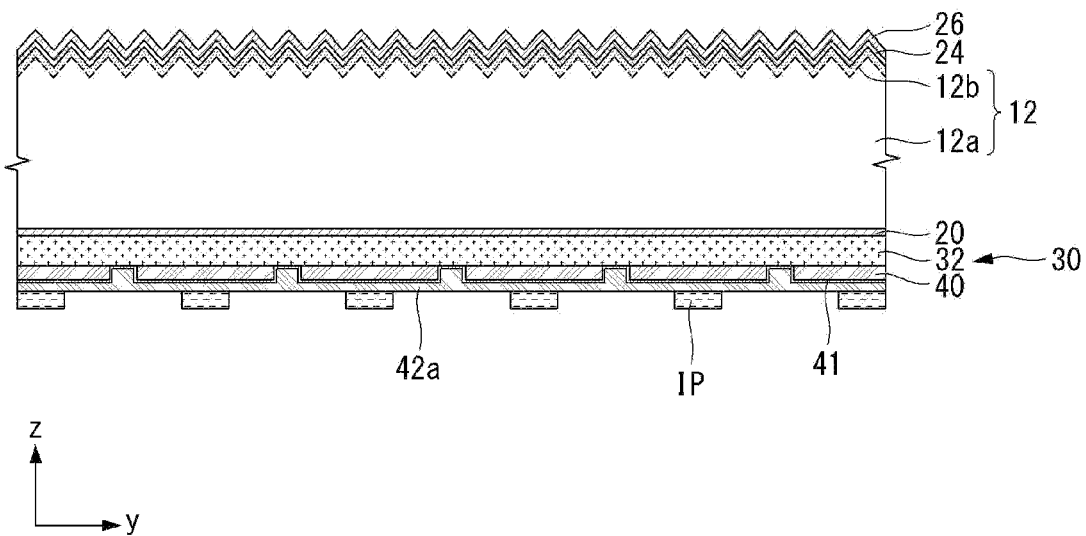
[FIG. 9d]
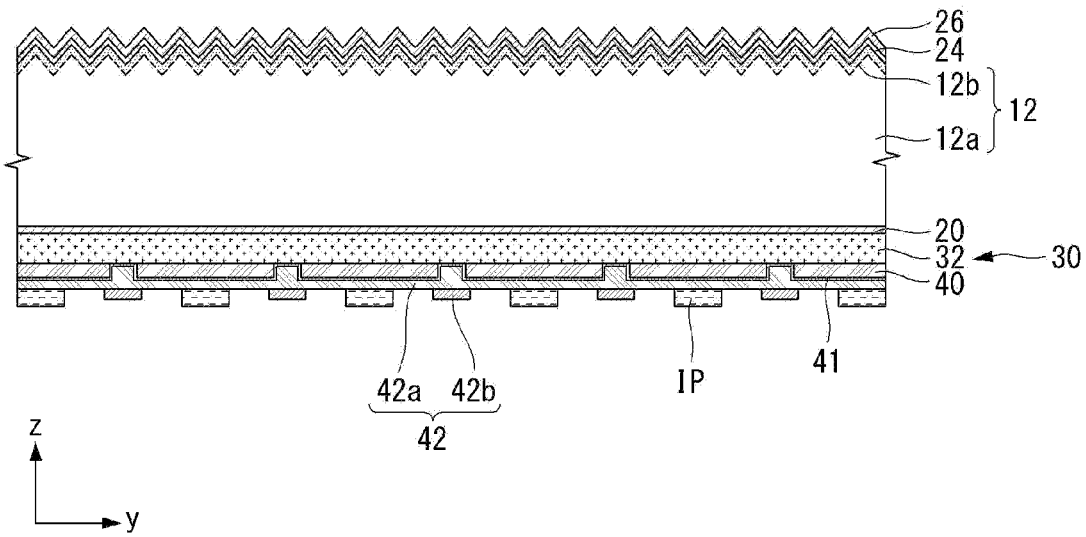

[FIG. 9e]
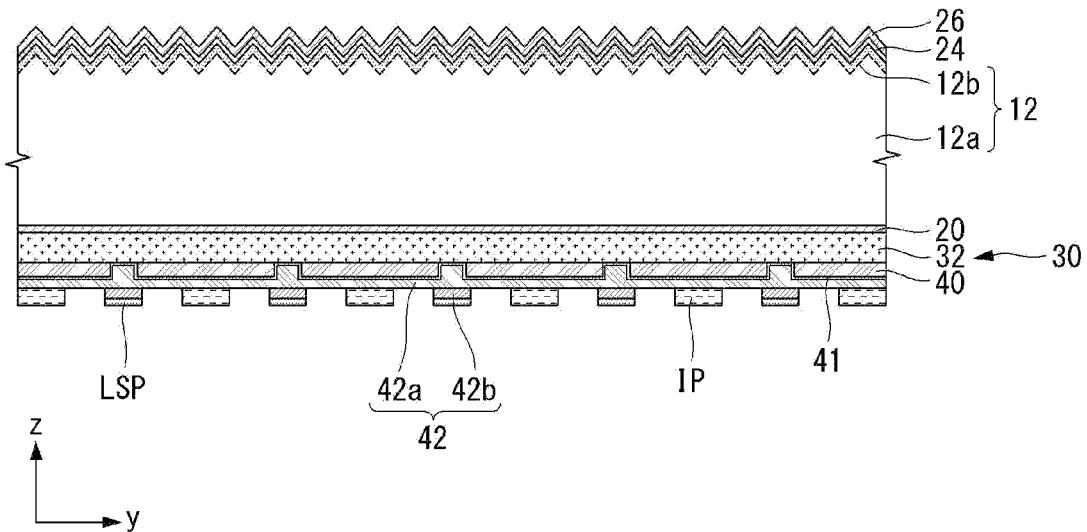
[FIG. 9f]
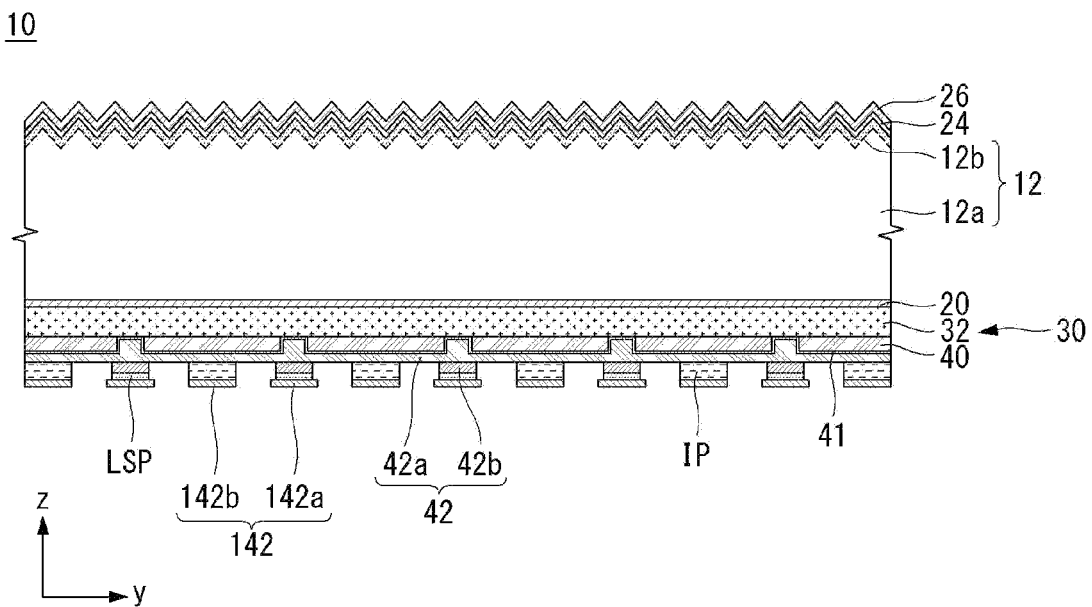

[FIG. 10]
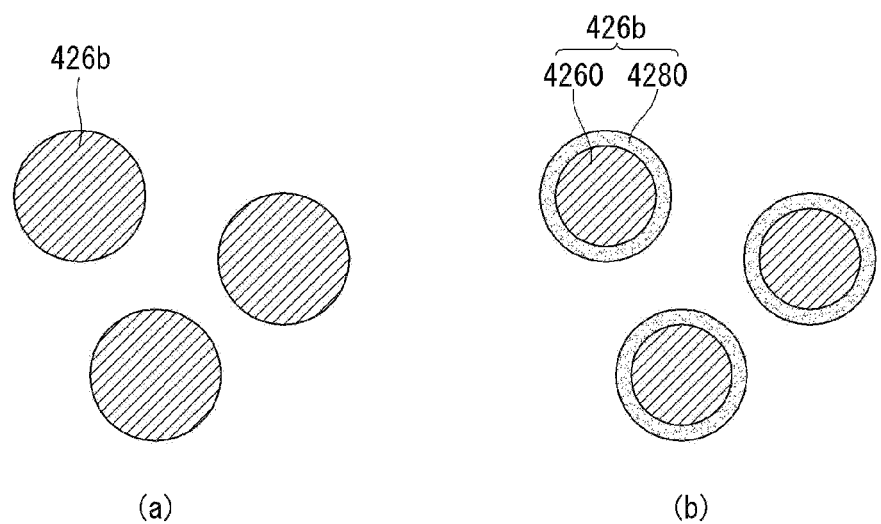
(a)          (b)

[FIG. 11]
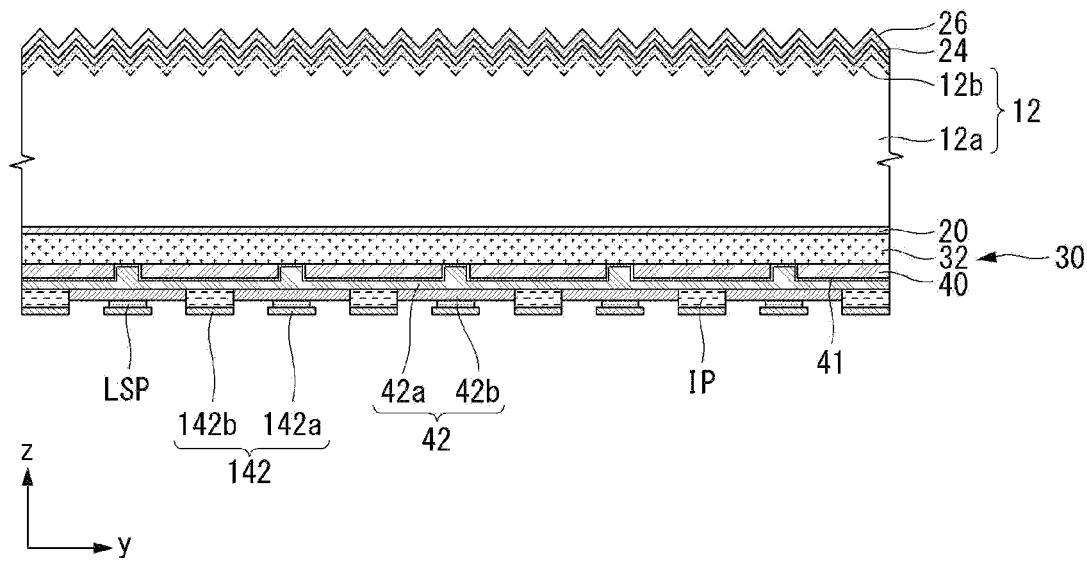
(a)
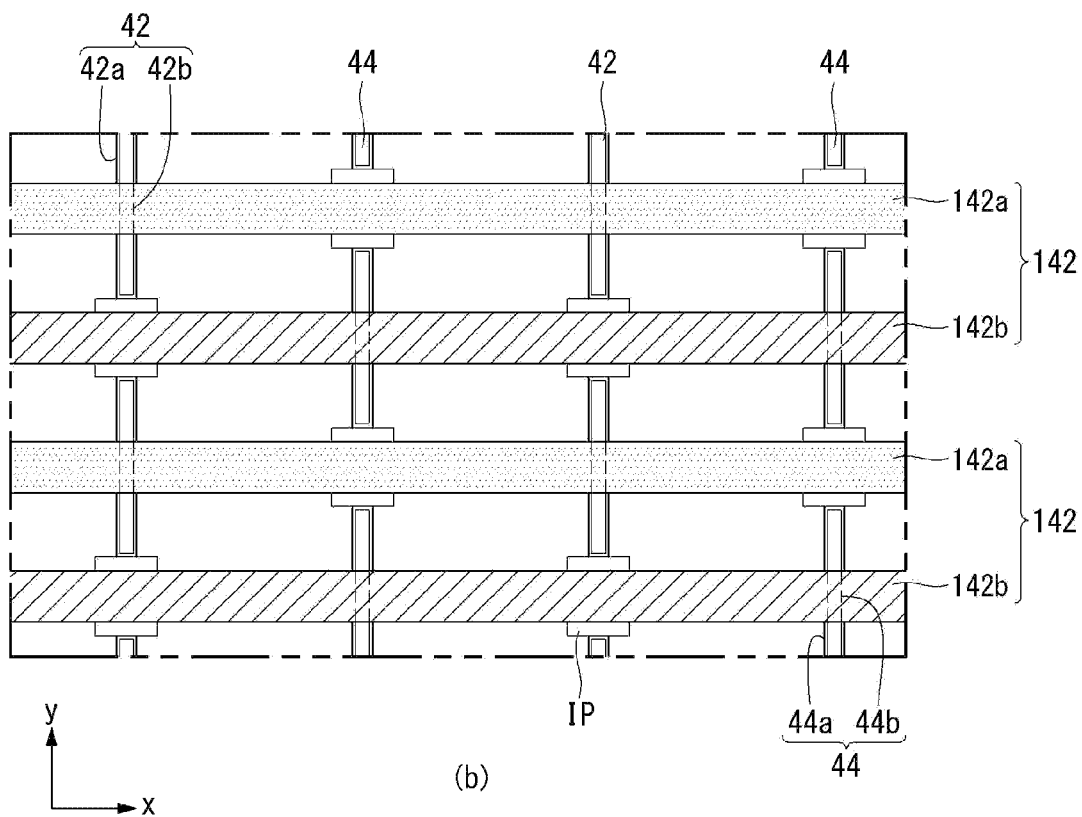
(b)

[FIG. 12]
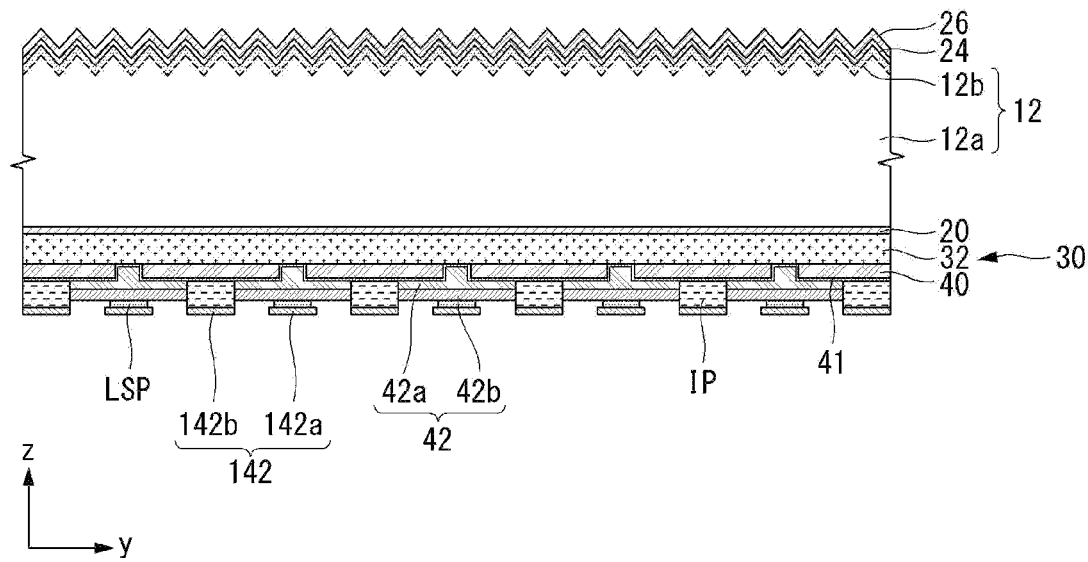
(a)
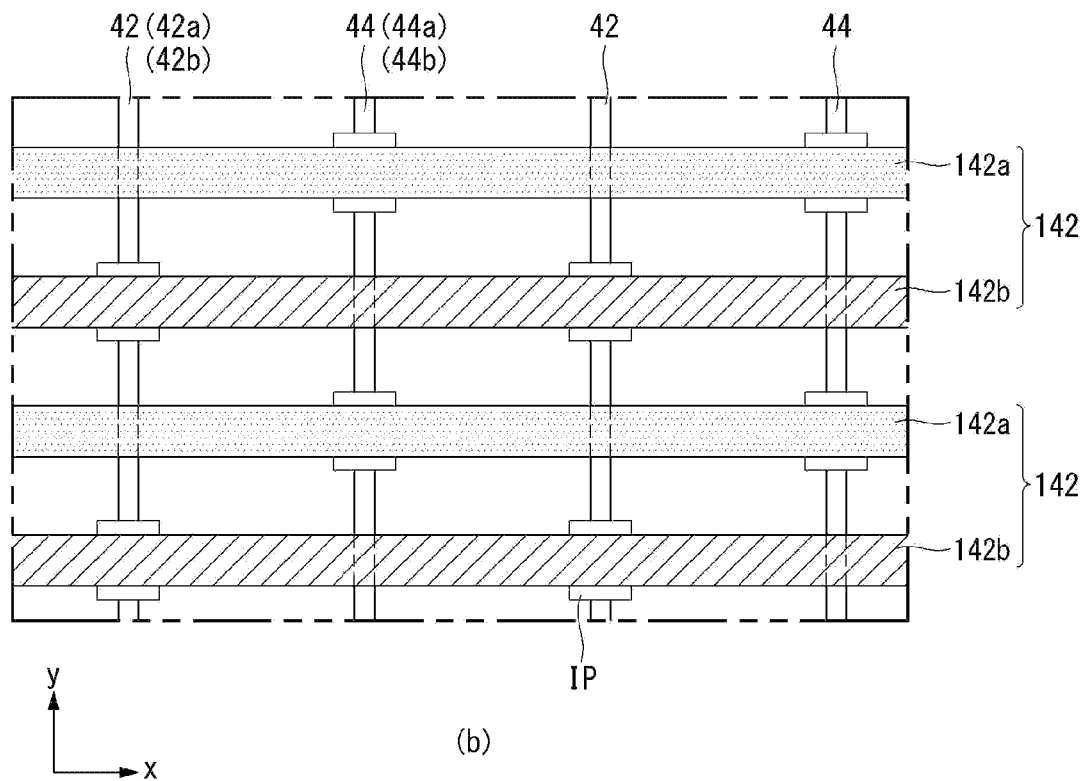
(b)

[FIG. 13]
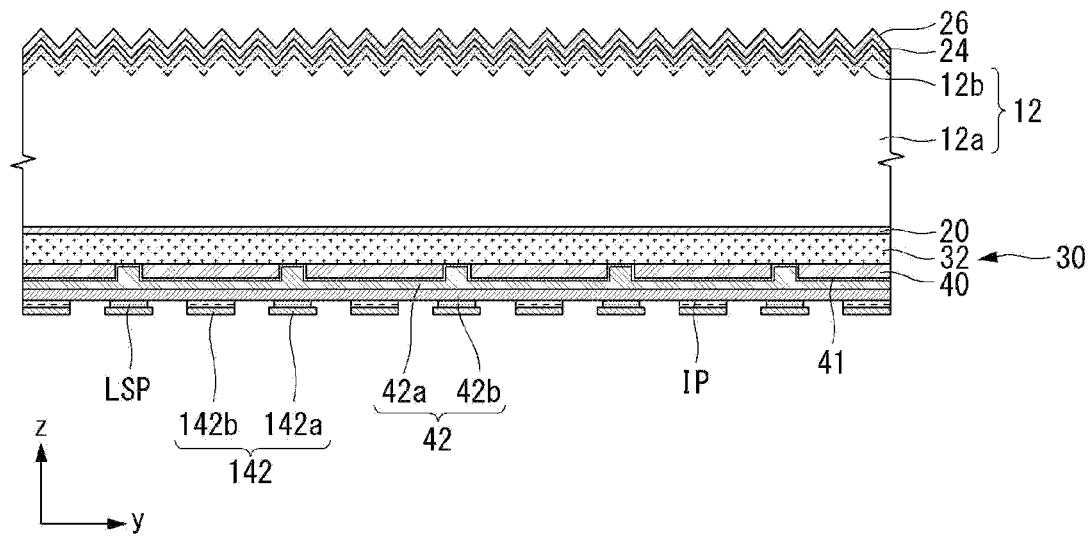
(a)
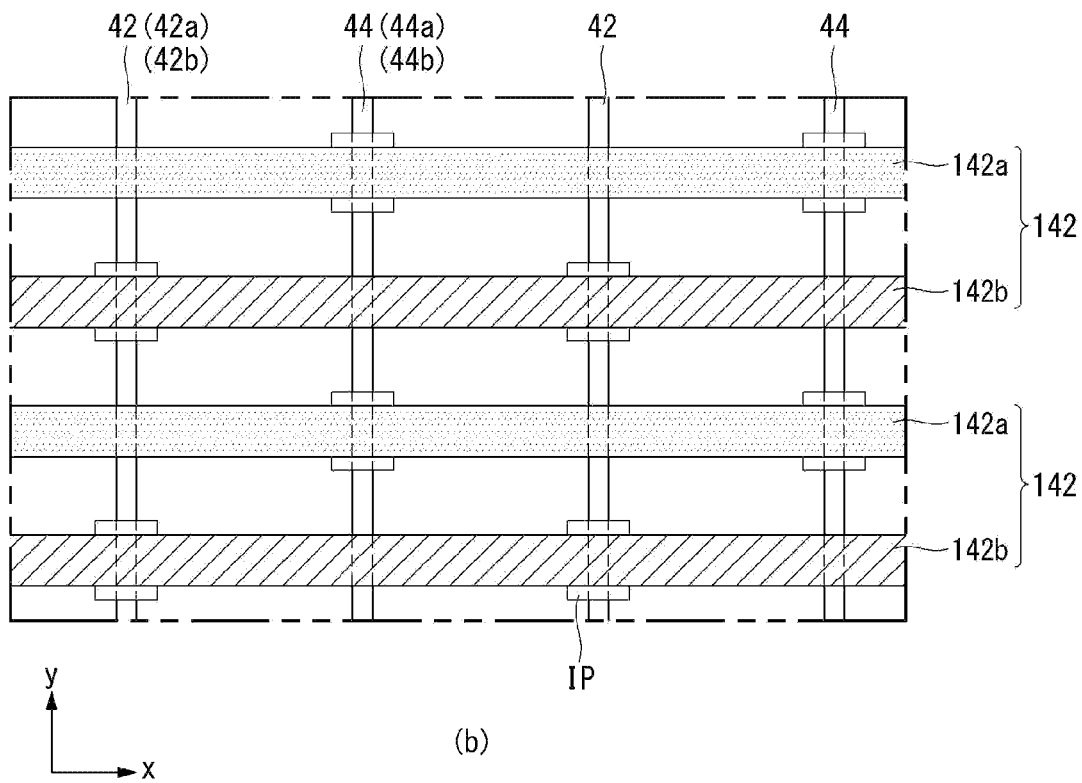
(b)

[FIG. 14]
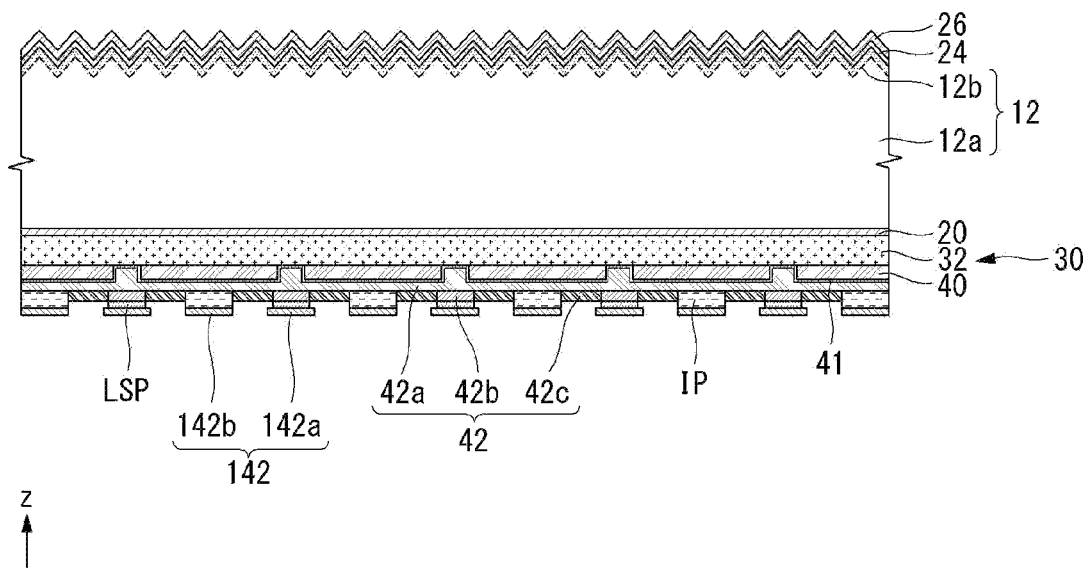
(a)
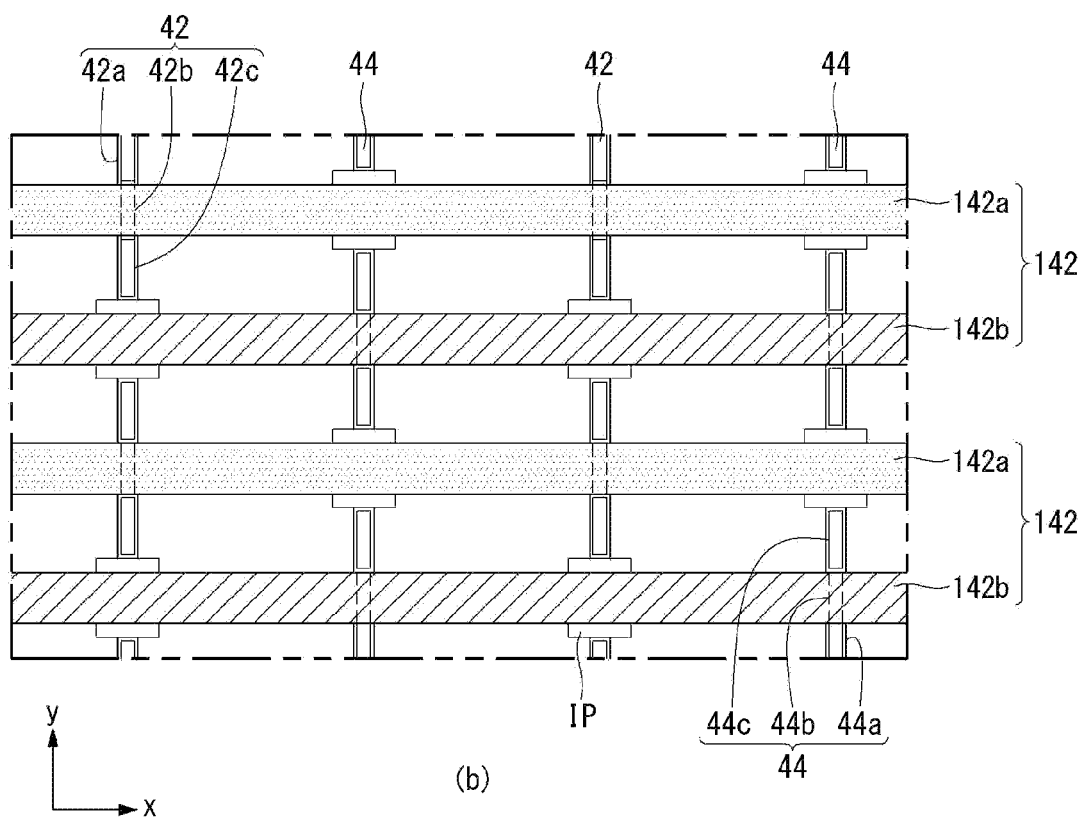
(b)

【FIG. 15】
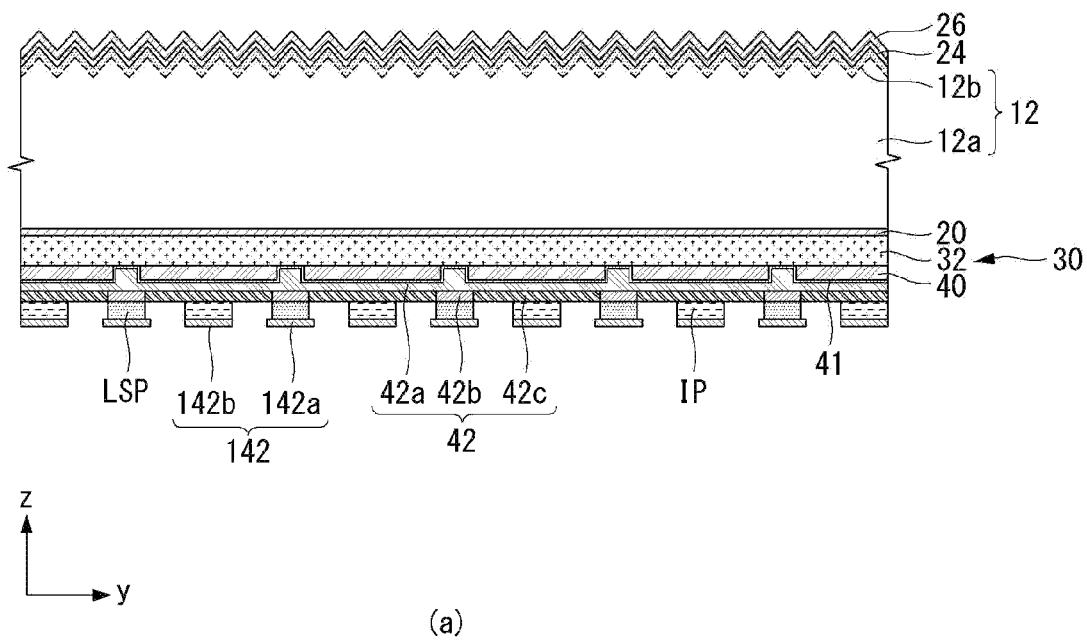
(a)
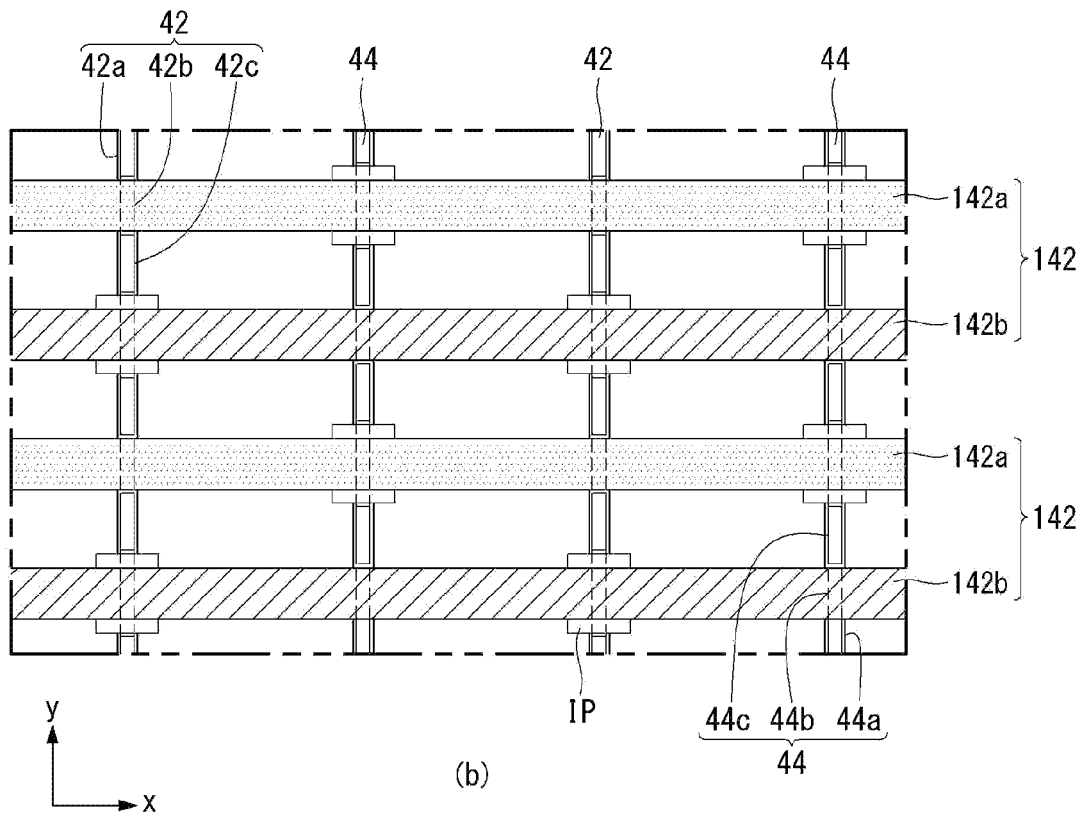
(b)

SOLAR CELL AND SOLAR CELL PANEL INCLUDING SAME

CROSS-REFERENCE TO RELATED APPLICATIONS

This application is a National Stage application under 35 U.S.C. § 371 of International Application No. PCT/KR2020/004767, filed on Apr. 8, 2020, which claims the benefit of Korean Patent Application No. 10-2019-0064720, filed on May 31, 2019. The disclosures of the prior applications are incorporated by reference in their entirety.

TECHNICAL FIELD

The present disclosure relates to a solar cell and a solar cell panel including the same, and more particularly, to a solar cell with an improved structure and an improved manufacturing process and a solar cell panel including the same.

BACKGROUND ART

A plurality of solar cells is connected in series or in parallel using ribbons, wiring members, etc. and is manufactured in the form of a solar cell panel by a packaging process for protecting the plurality of solar cells.

In order to improve efficiency of the solar cell and an output of the solar cell panel, it is required to design various layers and electrodes included in the solar cell and the solar cell panel. A back electrode structure, in which both first and second electrodes with different polarities are disposed on a back surface of a solar cell, was proposed to efficiently use light that is incident on the front.

In the solar cell panel including the solar cell having the back electrode structure, the electrodes are formed on the back surface of the solar cell using printing and sputtering processes, etc., and then a solder paste is formed on the electrode. Then, ribbon, wiring members, etc. are attached to the solder paste.

In order to simplify the manufacturing process and reduce an electrical resistance, the electrode may include a sputtering layer and a printing layer positioned on the sputtering layer. According to this, wetting of the solder paste with respect to the printing layer is not good, and thus adhesion characteristics between the printing layer and the solder paste positioned on the printing layer are not good.

As another example, if the electrode includes only the printing layer, a heat treatment process at a high temperature is necessary to fire the paste. Further, the characteristics of the solar cell could be changed undesirably or, in severe cases, the solar cell could be damaged due to a glass frit, etc. As another example, if the electrode includes only the sputtering layer, an electrical resistance may increase because it is difficult to sufficiently increase a thickness of the electrode.

As another example, if the electrode is formed using a plating process, the characteristics of the solar cell could be changed undesirably or, in severe cases, the solar cell could be damaged due to a plating solution. Further, if a pin hole, etc. exists in an insulating layer, an unwanted portion may be plated. In order to prevent this, a process becomes complicated because a seed layer needs to be separately formed prior to the plating process. In addition, it is difficult to reduce the manufacturing cost due to the cost such as material cost and waste treatment cost.

DISCLOSURE

Technical Problem

The present disclosure provides a solar cell and a solar cell panel including the same manufactured by a simple manufacturing process and having an excellent output.

More specifically, the present disclosure provides a solar cell and a solar cell panel including the same capable of improving an output and simplifying a manufacturing process by reducing an electrical resistance through an improvement in an electrode structure of the solar cell for an attachment to a wiring portion.

In particular, the present disclosure provides a solar cell and a solar cell panel including the same capable of improving an output and simplifying a manufacturing process by improving an electrode structure for an attachment to a wiring portion in the solar cell having a back electrode structure in which both first and second electrodes with different polarities are disposed on a back surface of the solar cell.

Technical Solution

In one aspect of the present disclosure, there is provide a solar cell panel comprising a solar cell including a semiconductor substrate, a plurality of first and second conductivity type regions positioned at the semiconductor substrate or on the semiconductor substrate, and a plurality of first and second electrodes electrically connected to the plurality of first and second conductivity type regions and extended in a first direction; a wiring portion including a plurality of first wiring members electrically connected to the plurality of first electrodes and extended in a second direction intersecting the first direction, and a plurality of second wiring members electrically connected to the plurality of second electrodes and extended in the second direction; a plurality of insulating members positioned in overlap portions of the plurality of first electrodes and the plurality of second wiring members and overlap portions of the plurality of second electrodes and the plurality of first wiring members; a sealing member surrounding the solar cell, the plurality of insulating members, and the wiring portion; a first cover member positioned on the sealing member and on one surface of the solar cell; and a second cover member positioned on the sealing member and on other surface of the solar cell. At least one of the first and second electrodes includes a main electrode portion and a connection electrode portion positioned on the main electrode portion. The connection electrode portion includes a particle connection layer formed by connecting a plurality of particles including a first metal, and a cover layer that includes a second metal different from the first metal and covers at least an outer surface of the particle connection layer.

The connection electrode portion may include a portion formed to extend along a longitudinal direction in the first electrode or the second electrode.

The connection electrode portion may be extended to connect at least the plurality of insulating members in the first electrode or the second electrode.

The wiring portion may be directly connected to the cover layer, or a low temperature solder paste may be directly positioned on the cover layer.

The solar cell panel may further comprise an intermetallic compound (IMC) layer, between the main electrode portion and the connection electrode portion, in which a metal included in the main electrode portion and the second metal are mixed.

The electrode may elongate along the first direction, and 100 or more electrodes may be provided in the second direction intersecting the first direction. A thickness of the connection electrode portion may be equal to or greater than 10 μm.

The connection electrode portion in at least one of the first and second electrodes may be comprised of a first connection electrode portion further including a solder material including the second metal and an adhesive material.

The connection electrode portion in at least one of the first and second electrodes may include a first connection electrode portion formed corresponding to a portion in which the first wiring member or the second wiring member is to be positioned, and a second connection electrode portion including a different material from the first connection electrode portion.

The first connection electrode portion may include the first metal, a solder material including the second metal, and an adhesive material. The second connection electrode portion may include the second metal, the solder material including the second metal, and a binder including a resin.

An adhesive force between the first connection electrode portion and the first wiring member or the second wiring member may be greater than an adhesive force between the second connection electrode portion and the first wiring member or the second wiring member.

A resistivity of the second connection electrode portion may be less than a resistivity of the first connection electrode portion.

An amount of the first metal included in the first connection electrode portion may be less than an amount of the first metal included in the second connection electrode portion.

The main electrode portion may elongate along the first direction, and the plurality of insulating members may be positioned on the main electrode portion and spaced apart from each other in the first direction. The connection electrode portion may contact two adjacent insulating members among the plurality of insulating members in the first direction and may be extended to connect the two adjacent insulating members.

The first and second electrodes may elongate along the first direction, and the plurality of insulating members may be spaced apart from each other in the first direction. The main electrode portion and the connection electrode portion may contact two adjacent insulating members among the plurality of insulating members in the first direction and may be extended to connect the two adjacent insulating members.

The main electrode portion and the connection electrode portion may elongate along the first direction, and the plurality of insulating members may be positioned on the main electrode portion and spaced apart from each other in the first direction.

The first metal may have a resistivity that is equal to or less than a resistivity of a material of the main electrode portion or the second electrode, and the second metal may include tin (Sn).

The first metal may include copper.

In another aspect of the present disclosure, there is provide a solar cell panel comprising a plurality of solar cells each including a semiconductor substrate, a conductivity type region positioned at the semiconductor substrate or on the semiconductor substrate, and an electrode electrically connected to the conductivity type region; and a wiring portion electrically connected to the electrode of each solar cell and configured to connect in series the plurality of solar cells. The electrode includes a main electrode portion comprised of a plurality of electrode layers formed by a deposition, and a connection electrode portion that is positioned on the main electrode portion and is formed by printing a metal electrode paste including a solder material. The wiring portion may be directly connected to the connection electrode portion or may be electrically connected to the connection electrode portion by a low temperature solder paste.

In another aspect of the present disclosure, there is provide a solar cell comprising a semiconductor substrate; a conductivity type region positioned at the semiconductor substrate or on the semiconductor substrate; and an electrode electrically connected to the conductivity type region, wherein the electrode includes a first electrode portion and a second electrode portion positioned on the first electrode portion. The second electrode portion includes a particle connection layer formed by connecting a plurality of particles including a first metal, and a cover layer that includes a second metal different from the first metal and covers at least an outer surface of the particle connection layer. The particle connection layer incudes a first portion and a second portion in which an amount of the first metal is less than that in the first portion.

Advantageous Effects

According to the present disclosure, a connection electrode portion included in an electrode can serve as an electrode for collecting and delivering electric current with a low electrical resistance, and as a solder paste for attachment to a wiring portion by including a solder material and an adhesive material. Hence, a separate solder paste layer formed corresponding to each overlap portion is not required for the substantial connection of the wiring portion and the electrode. As a result, a solar cell panel can be manufactured through the simple manufacturing process and can have excellent efficiency and output due to a low resistivity. In particular, in a solar cell having a back electrode structure in which both first and second electrodes with different polarities are provided on a back surface, the solar cell panel can efficiently improve the output and greatly simplify the manufacturing process by improving the electrode structure for the attachment to the wiring portion.

DESCRIPTION OF DRAWINGS

FIG. 1 is an exploded perspective view schematically illustrating a solar cell panel according to an embodiment of the present disclosure.

FIG. 2 is a partial cross-sectional view conceptually illustrating two solar cells included in a solar cell panel illustrated in FIG. 1 and a wiring portion connecting the two solar cells.

FIG. 3 is a cross-sectional view schematically illustrating a solar cell included in a solar cell panel illustrated in FIG. 1.

FIG. 4 is a cross-sectional view schematically illustrating a solar cell included in a solar cell panel according to a modified example of the present disclosure.

FIG. 5 is a cross-sectional view schematically illustrating a solar cell included in a solar cell panel according to another modified example of the present disclosure.

FIG. 6 is a rear plan view schematically illustrating two solar cells, an insulating member, and a wiring portion included in a solar cell panel illustrated in FIG. 1.

FIG. 7 is a partial cross-sectional view taken along line VII-VII of FIG. 6.

FIG. 8 is a partial cross-sectional view schematically illustrating two solar cells, an insulating member, and a wiring portion included in a solar cell panel according to another modified example of the present disclosure.

FIGS. 9a to 9f are cross-sectional views partially illustrating a method for manufacturing a solar cell panel according to an embodiment of the present disclosure.

FIG. 10 schematically illustrates metal particles included in a paste used for forming a connection electrode portion in a method for manufacturing a solar cell panel (100) according to an embodiment of the present disclosure.

FIG. 11 is a rear plan view and a partial cross-sectional view thereof schematically illustrating two solar cells, an insulating member, and a wiring portion included in a solar cell panel according to another modified example of the present disclosure.

FIG. 12 is a rear plan view and a partial cross-sectional view thereof schematically illustrating two solar cells, an insulating member, and a wiring portion included in a solar cell panel according to another modified example of the present disclosure.

FIG. 13 is a rear plan view and a partial cross-sectional view thereof schematically illustrating two solar cells, an insulating member, and a wiring portion included in a solar cell panel according to another modified example of the present disclosure.

FIG. 14 is a rear plan view and a partial cross-sectional view thereof schematically illustrating two solar cells, an insulating member, and a wiring portion included in a solar cell panel according to another embodiment of the present disclosure.

FIG. 15 is a rear plan view and a partial cross-sectional view thereof schematically illustrating two solar cells, an insulating member, and a wiring portion included in a solar cell panel according to another modified example of the present disclosure.

MODE FOR INVENTION

Reference will now be made in detail to embodiments of the present disclosure, examples of which are illustrated in the accompanying drawings. This disclosure may, however, be embodied in many different forms and should not be construed as limited to the embodiments set forth herein.

In the drawings, illustration of parts unrelated to embodiments of the present disclosure is omitted for clarity and simplicity of description. The same reference numerals designate the same or very similar components throughout the present disclosure. In the drawings, thickness, width, etc. of components are exaggerated or reduced for clarity of description, and should not be construed as limited to those illustrated in the drawings.

It will be understood that the terms "comprise" and/or "comprising," or "include" and/or "including" used in the present disclosure specify the presence of stated components, but do not preclude the presence or addition of one or more other components. In addition, it will be understood that, when a component such as a layer, film, area, or plate is referred to as being "on" another component, it may be directly disposed on another component or may be disposed such that an intervening component is also between them. Accordingly, when a component such as a layer, film, area, or plate is disposed "directly on" another component, this means that there is no intervening component between the components.

Hereinafter, a solar cell, a solar cell panel including the same, and a method for manufacturing the solar cell panel according to embodiments of the present disclosure will be described in detail with reference to the accompanying drawings.

FIG. 1 is an exploded perspective view schematically illustrating a solar cell panel according to an embodiment of the present disclosure. FIG. 2 is a partial cross-sectional view conceptually illustrating two solar cells included in a solar cell panel illustrated in FIG. 1 and a wiring portion connecting the two solar cells. For a clear distinction, two solar cells 10 adjacent to each other are hereinafter referred to as a first solar cell 10a and a second solar cell 10b. In the present disclosure, the terms such as first, second, etc. may be used only for the purpose of distinguishing components from each other, and the present disclosure is not limited thereto.

Referring to FIGS. 1 and 2, a solar cell panel 100 according to an embodiment of the present disclosure includes a solar cell 10 and a wiring portion 140 electrically connected to the solar cell 10. The solar cell panel 100 includes a sealing member 130 that surrounds and seals the solar cell 10 and the wiring portion 140, a first cover member 110 positioned on the sealing member 130 and at one surface (e.g., front surface) of the solar cell 10, and a second cover member 120 positioned on the sealing member 130 and at other surface (e.g., back surface) of the solar cell 10. This will be described in more detail.

The solar cell 10 may include a semiconductor substrate (reference numeral 12 in FIG. 3, hereinafter the same) and first and second electrodes (reference numerals 42 and 44 in FIG. 3, hereinafter the same) positioned on one surface (e.g., back surface) of the semiconductor substrate 12. This will be described in detail later with reference to FIG. 3.

In the present embodiment, the solar panel 100 includes a plurality of solar cells 10, and the plurality of solar cells 10 may be electrically connected in series, parallel, or series-parallel by the wiring portion 140.

Specifically, the wiring portion 140 may include a wiring member 142 whose at least a part overlaps the first and second electrodes 42 and 44 of the solar cell 10 and is connected to the first and second electrodes 42 and 44, and a connecting wiring member 144 that is positioned between the solar cells 10 in a direction intersecting the wiring member 142 and is connected to the wiring member 142. The plurality of solar cells 10 may be connected in one direction (the x-axis direction in the drawing) by the wiring member 142 and the connecting wiring member 144 to form one column (i.e., a solar cell string). The wiring member 142 and the connecting wiring member 144 will be described in more detail later with reference to FIG. 6. The wiring portion 140 may further include a bus bar wiring member 146 that is positioned at both ends of the solar cell string and connects the solar cell string to another solar cell string or junction box (not shown).

The wiring member 142, the connecting wiring member 144, and the bus bar wiring member 146 each may include a conductive material (e.g., a metal material). For example, the wiring member 142, the connecting wiring member 144, or the bus bar wiring member 146 may include a conductive core including any one of gold (Au), silver (Ag), copper (Cu), or aluminum (Al), and a conductive coating layer including tin (Sn) or an alloy including tin, positioned on the surface of the conductive core. For example, the core may be formed of copper, and the conductive coating layer may be formed of an alloy (e.g., SnBiAg) containing tin. However, the present disclosure is not limited thereto, and the material, shape, connection structure, etc. of the wiring member 142, the connecting wiring member 144, or the bus bar wiring member 146 may be variously changed. In addition, neighboring solar cells 10 may be connected by only the wiring member 142 without providing the connecting wiring member 144.

The sealing member 130 may include a first sealing member 131 positioned on the front surface of the solar cell 10 connected by the wiring member 142, and a second sealing member 132 positioned on the back surface of the solar cell 10. The first sealing member 131 and the second sealing member 132 prevent moisture and oxygen from being introduced and chemically couple components of the solar cell panel 100. The first and second sealing members 131 and 132 may be made of an insulating material with transparency and adhesiveness. For example, the first sealing member 131 and the second sealing member 132 may be formed using ethylene vinyl acetate copolymer (EVA) resin, polyvinyl butyral, silicon resin, ester-based resin, olefin-based resin, or the like. The second cover member 120, the second sealing member 132, the solar cell 10, the wiring portion 140, the first sealing member 131, and the first cover member 110 may be integrated by a lamination process or the like using the first and second sealing members 131 and 132 to form the solar cell panel 100.

The first cover member 110 is positioned on the first sealing member 131 to form the front surface of the solar cell panel 100, and the second cover member 120 is positioned on the second sealing member 132 to form the back surface of the solar cell panel 100. The first cover member 110 and the second cover member 120 each may be made of an insulating material capable of protecting the solar cell 10 from external shock, moisture, ultraviolet rays, or the like. The first cover member 110 may be made of a light transmitting material capable of transmitting light, and the second cover member 120 may be made of a sheet consisting of a light transmitting material, a non-light transmitting material, or a reflective material, etc. For example, the first cover member 110 may be formed of a glass substrate or the like, and the second cover member 120 may be formed of a film, a sheet or the like. The second cover member 120 may have a TPT (Tedlar/PET/Tedlar) type, or include a polyvinylidene fluoride (PVDF) resin layer formed on at least one surface of a base film (e.g., polyethylene terephthalate (PET)).

However, the present disclosure is not limited thereto. Accordingly, the first and second sealing members 131 and 132, the first cover member 110, or the second cover member 120 may include various materials other than those described above, and may have various shapes. For example, the first cover member 110 or the second cover member 120 may have various shapes (for example, a substrate, a film, a sheet, etc.) or materials.

After the solar cell 10 included in the solar cell panel 100 according to an embodiment of the present disclosure is described in detail with reference to FIG. 3, the wiring portion 140 and an insulating member (reference numeral IP in FIG. 6, hereinafter the same) connected to the solar cell 10 are described in detail with reference to FIGS. 6 and 7.

FIG. 3 is a cross-sectional view schematically illustrating the solar cell 10 included in the solar cell panel 100 illustrated in FIG. 1. For example, FIG. 3 illustrates that the first and second electrodes 42 and 44 each include main electrode portions (first electrode portions) 42a and 44a and connection electrode portions (second electrode portions) 42b and 44b, by way of example.

Referring to FIG. 3, the solar cell 10 according to the present embodiment includes a semiconductor substrate 12, first and second conductivity type regions 32 and 34 formed at or on one surface (e.g., the back surface) of the semiconductor substrate 12, first and second electrodes 42 and 44 respectively connected to the first and second conductivity type regions 32 and 34 on the one surface of the semiconductor substrate. As described above, the solar cell 10 may have a back electrode structure in which the first and second conductivity type regions 32 and 34 and the first and second electrodes 42 and 44 related to carriers of opposite polarities are positioned on the back surface of the semiconductor substrate 12 to be spaced apart from each other.

For example, the semiconductor substrate 12 may include a base region 12a formed of a crystalline semiconductor (e.g., a single crystal or polycrystalline semiconductor, for example, a single crystal or polycrystalline silicon, in particular, the single crystal silicon) including a first or second conductivity type dopant. As described above, the solar cell 10 based on the base region 12a or the semiconductor substrate 12 having fewer defects due to high crystallinity has excellent electrical characteristics.

A front surface field region 12b may be positioned on the front surface of the semiconductor substrate 12. For example, the front surface field region 12b is a doped region having the same conductivity type as the base region 12a and having a higher doping concentration than the base region 12a, and may form a part of the semiconductor substrate 12. However, the present disclosure is not limited thereto. Thus, various modifications are possible. For example, the front surface field region 12b may be a semiconductor layer positioned separately from the semiconductor substrate 12, or may be formed of an oxide layer, etc. having a fixed charge or the like without a dopant.

In addition, the front surface of the semiconductor substrate 12 has an anti-reflection structure (for example, a pyramid-shaped texturing structure formed of (111) plane of the semiconductor substrate 12) for preventing reflection, and thus can minimize the reflection. In addition, the back surface of the semiconductor substrate 12 is formed of a mirror polished surface to have a smaller surface roughness than that of the front surface, and thus can improve passivation characteristics. However, the present disclosure is not limited thereto and can be variously modified.

An interlayer 20 may be positioned between the semiconductor substrate 12 and the conductivity type regions 32 and 34 on the back surface of the semiconductor substrate 12. The interlayer 20 may be positioned on (e.g., contact) the entire back surface of the semiconductor substrate 12.

The interlayer 20 may serve as a passivation layer for passivating the surface of the semiconductor substrate 12. Alternatively, the interlayer 20 may serve as a dopant control or a diffusion barrier that prevents dopants in the conductivity type regions 32 and 34 from excessively diffusing into the semiconductor substrate 12. The interlayer 20 may include various materials capable of performing the above-described role. For example, the interlayer 20 may be formed of an oxide layer, a dielectric layer or an insulating layer containing silicon, a nitride oxide layer, a carbon oxide layer, an intrinsic amorphous silicon layer, or the like. For example, when the conductivity type regions 32 and 34 are formed of a polycrystalline semiconductor, the interlayer 20 may be easily manufactured and may be a silicon oxide layer that enables smooth carrier transfer. As another example, when the conductivity type regions 32 and 34 are formed of an amorphous semiconductor, the interlayer 20 may be formed of the intrinsic amorphous silicon layer.

A thickness of the interlayer 20 may be less than those of a front passivation layer 24, an anti-reflection layer 26, and a back passivation layer 40. For example, the thickness of the interlayer 20 may be 10 nm or less (e.g., 5 nm or less, more specifically, 2 nm or less, for example, 0.5 nm to 2 nm). This is to fully realize the effect of the interlayer 20, but the present disclosure is not limited thereto.

A semiconductor layer 30 including the conductivity type regions 32 and 34 may be positioned on (e.g., contact) the interlayer 20. In this embodiment, the conductivity type regions 32 and 34 may include a first conductivity type region 32 having a first conductivity type and a second conductivity type region 34 having a second conductivity type opposite to the first conductivity type. More specifically, the first conductivity type region 32 and the second conductivity type region 34 may be positioned together in the semiconductor layer 30 continuously formed on the interlayer 20, and may be positioned on the same plane. In addition, a barrier area 36 may be positioned on the same plane between the first conductivity type region 32 and the second conductivity type region 34.

The first and second conductivity type regions 32 and 34, and the barrier area 36, or the semiconductor layer 30 may have a different crystal structure from that of the semiconductor substrate 12. For example, the first and second conductivity type regions 32 and 34, and the barrier area 36, or the semiconductor layer 30 may include an amorphous semiconductor, a microcrystalline semiconductor, a polycrystalline semiconductor (e.g., amorphous silicon, microcrystalline silicon, or polycrystalline silicon), or the like, and the first conductivity type region 32 may include the first conductivity type dopant, and the second conductivity type region 34 may include the second conductivity type dopant. The barrier area 36 may be formed of an intrinsic or undoped semiconductor that is not doped with the first and second conductivity type dopants. In this instance, when the first and second conductivity type regions 32 and 34, and the barrier area 36, or the semiconductor layer 30 have a polycrystalline semiconductor, they may have a high carrier mobility. Further, when the first and second conductivity type regions 32 and 34, and the barrier area 36, or the semiconductor layer 30 have an amorphous semiconductor, they may be formed by a simple process.

In this instance, if the base region 12a has the second conductivity type, the first conductivity type region 32 having a different conductivity type from the base region 12a serves as an emitter region, and the second conductivity type region 34 having the same conductivity type as the base region 12a serves as a back surface field region. The barrier area 36 physically separates the first conductivity type region 32 and the second conductivity type region 34, and thus can prevent a shunt that may occur when they contact each other.

In this instance, an area (e.g., a width) of the first conductivity type region 32 may be larger than an area (e.g., a width) of the second conductivity type region 34. Accordingly, the first conductivity type region 32 serving as the emitter region has a larger area than the second conductivity type region 34 serving as the back surface field region, which may be advantageous for photoelectric conversion.

As described above, the first and second conductivity type regions 32 and 34 are formed of a separate layer different from the semiconductor substrate 12 with the interlayer 20 interposed therebetween. As a result, a loss due to recombination can be minimized as compared to the case where a doped region formed by doping a dopant in the semiconductor substrate 12 is used as a conductivity region. The barrier area 36 is formed of an intrinsic or undoped semiconductor, and thus can simplify the process of forming the barrier area 36.

However, the present disclosure is not limited thereto. For example, the interlayer 20 may not be provided. Alternatively, at least one of the first and second conductivity type regions 32 and 34 may be formed as a doped region in which a dopant is doped and formed in a part of the semiconductor substrate 12 to form the part of the semiconductor substrate 12. The barrier area 36 may not be provided, or the barrier area 36 may include a material other than the semiconductor material. Other modifications may be used.

When the first or second conductivity type dopant is p-type, a group III element such as boron (B), aluminum (Al), gallium (Ga), and indium (In) may be used. When the first or second conductivity type dopant is n-type, a group V element such as phosphorus (P), arsenic (As), bismuth (Bi), and antimony (Sb) may be used. For example, one of the first and second conductivity type dopants may be boron (B), and the other may be phosphorus (P).

The front passivation layer 24 and the anti-reflection layer 26 may be positioned on (e.g., contact) the front surface of the semiconductor substrate 12, and the back passivation layer 40 including a contact hole 40a may be positioned on (e.g., contact) the conductivity type regions 32 and 34 or the semiconductor layer 30. The front passivation layer 24 and the anti-reflection layer 26 may be entirely formed on the front surface of the semiconductor substrate 12, and the back passivation layer 40 may be entirely formed on the semiconductor layer 30 except for the contact hole 40a. For example, the front passivation layer 24, the anti-reflection layer 26, or the back passivation layer 40 may not include a dopant to have excellent insulation properties, passivation characteristics, and the like.

For example, the front passivation layer 24, the anti-reflection layer 26, or the back passivation layer 40 may have a silicon nitride layer, a silicon nitride layer containing hydrogen, a silicon oxide layer, a silicon oxynitride layer, an aluminum oxide layer, a silicon carbide layer, any one single layer selected from a group consisting of $MgF_2$, ZnS, $TiO_2$ and $CeO_2$, or a multi-layered structure in which two or more layers are combined.

Further, the first electrode 42 may be electrically connected to the first conductivity type region 32 through a contact hole 46, and the second electrode 44 may be electrically connected to the second conductivity type region 34 through the contact hole 46. The detailed material, structure, etc. of the first and second electrodes 42 and 44 are described in detail later.

In this embodiment, the first conductivity type region 32 may extend in a first direction (y-axis direction in the drawing), and the plurality of first conductivity type regions 32 may be provided in a second direction (x-axis direction in the drawing) to form a stripe shape. The second conductivity type region 34 may extend in the first direction (y-axis direction in the drawing), and the plurality of second conductivity type regions 34 may be provided in the second direction (x-axis direction in the drawing) to form a stripe shape. The first conductivity type regions 32 and the second conductivity type regions 34 may be alternately positioned in the second direction, and the barrier area 36 may be positioned between the first conductivity type region 32 and the second conductivity type region 34 to separate them. The first electrode 42 may be formed in a stripe shape correspondingly to the first conductivity type regions 32, and the second electrode 44 may be formed in a stripe shape correspondingly to the second conductivity type region 34.

The contact hole 46 may be formed so that only parts of the first and second electrodes 42 and 44 are connected to the first conductivity type region 32 and the second conductivity type region 34, respectively. For example, the plurality of contact holes 46 may be provided corresponding to one first electrode 42 or one second electrode 44. Alternatively, each contact hole 46 may be formed to have the total length of the first and second electrodes 42 and 44 correspondingly to the first and second electrodes 42 and 44. Hence, the present disclosure can maximize a contact area between the first and second electrodes 42 and 44 and the first and second conductivity type regions 32 and 34 and improve carrier collection efficiency. Various other modifications can be used.

As described above, a width of the first conductivity type region 32 may be greater than a width of the second conductivity type region 34, and correspondingly, a width of the first electrode 42 (each of the main electrode portion 42a and the connection electrode portion 42b of the first electrode 42) may be greater than a width of the second electrode 44 (each of the main electrode portion 44a and the connection electrode portion 44b of the second electrode 44). However, the present disclosure is not limited. For example, a width of the first electrode 42 (each of the main electrode portion 42a and the connection electrode portion 42b of the first electrode 42) may be equal to or less than a width of the second electrode 44 (each of the main electrode portion 44a and the connection electrode portion 44b of the second electrode 44).

When light is incident on the solar cell 10 according to this embodiment, electrons and holes are generated by a photoelectric conversion in a p-n junction formed between the base region 12a and the first conductivity type region 32. The generated holes and electrons pass through the interlayer 20, move to the first conductivity type region 32 and the second conductivity type region 34, respectively, and then move to the first and second electrodes 42 and 44. Hence, electric energy is generated.

In the solar cell 10 with a back electrode structure in which the electrodes 42 and 44 are formed on the back surface of the semiconductor substrate 12 and the electrode is not formed on the front surface of the semiconductor substrate 12 as in the present embodiment, a shading loss at the front surface of the semiconductor substrate 12 can be minimized. Hence, efficiency of the solar cell 10 can be improved. However, the present disclosure is not limited thereto. Furthermore, since the first and second conductivity type regions 32 and 34 are formed on the semiconductor substrate 12 with the interlayer 20 interposed therebetween, the first and second conductivity type regions 32 and 34 are formed as separate layers different from the semiconductor substrate 12. Accordingly, a loss attributable to a recombination can be minimized compared to when a doping region formed by doping a dopant into the semiconductor substrate 12 is used as a conductivity type region.

In the present embodiment, the first electrode 42 and the second electrode 44 may be made of a conductive material (e.g., metal). Hereinafter, the lamination structure of the first and/or second electrode(s) 42 and/or 44 is described in detail with reference to the enlarged circle of FIG. 3. In the enlarged circle of FIG. 3, the first electrode 42 has been enlarged and illustrated, but the second electrode 44 may have the same lamination structure. Accordingly, hereinafter, the first or second conductivity type region 32 or 34 is denoted as the conductivity type regions 32 and 34, and the first or second electrode 42 or 44 connected to the conductivity type region is denoted as the electrodes 42 and 44.

Furthermore, main electrode portions 42a and 44a of the first and/or second electrode(s) 42 and/or 44 are denoted as the main electrode portion 42a, and the connection electrode portions 42b and 44b of the first and/or second electrode(s) 42 and/or 44 are denoted as the second electrode portion 42b.

The present embodiment has been illustrated and described that an insulating layer 41 is positioned between the conductivity type regions 32 and 34 and the electrodes 42 and 44 and the electrodes 42 and 44, the insulating layer 41 and the conductivity type regions 32 and 34 form a metal-insulating layer-semiconductor (MIS) structure.

More specifically, the insulating layer 41 is positioned between the conductivity type regions 32 and 34 and the electrodes 42 and 44 within the contact hole 46 of the back passivation layer 40. Hence, a reduction of passivation characteristics, which may occur because the back passivation layer 40 is removed, can be effectively prevented. Furthermore, interface contact characteristics can be improved compared to when the conductivity type regions 32 and 34 and the electrodes 42 and 44 directly contact each other. Furthermore, the insulating layer 41 can prevent a damage to the conductivity type regions 32 and 34 in various processes performed after the contact hole 46 is formed.

In the present embodiment, the insulating layer 41 may include refractory metal oxide formed by a combination of a refractory metal and oxygen. For example, the insulating layer 41 may be a refractory metal oxide layer made of refractory metal oxide. An insulating layer formed of silicon oxide has a low reflectance, but the insulating layer 41 has a high refractive index, so a reflectance of a long wavelength can be further improved. Accordingly, light that reaches the back surface of the semiconductor substrate 12 can be effectively reflected. In this case, the insulating layer 41 formed of refractory metal oxide is formed by an atomic layer deposition method not chemical vapor deposition, and may have a high film density and excellent crystallizability. As a result, the reflection of light can be more effectively improved and contact resistance of the electrodes 42 and 44 can be significantly reduced by minimizing the absorption of light.

For example, the insulating layer 41 may include titanium oxide (TiOx) (e.g., $TiO_2$) or molybdenum oxide (MoOx) (e.g., $MoO_2$ or $MoO_3$). For example, the insulating layer 41 may be formed of a titanium oxide layer or a molybdenum oxide layer, and may be formed of a titanium oxide layer, particularly. Titanium oxide or molybdenum oxide has a high reflectance with respect to light of a long wavelength, and can reduce the contact resistance of the electrodes 42 and 44. Particularly, titanium oxide has such excellent effects. More specifically, if the insulating layer 41 includes titanium oxide having an anatase phase, reflectance improvement and contact resistance reduction effects can be significantly improved because the insulating layer 41 has more excellent crystallizability and a higher refractive index than titanium oxide having other phase. However, the present disclosure is not limited thereto, and the insulating layer 41 may include titanium oxide having other phase (e.g., rutile phase).

In this instance, since the conductivity type regions 32 and 34 and the electrodes 42 and 44 are electrically connected with the insulating layer 41 interposed therebetween, the insulating layer 41 may be thinly formed so that electrical connection characteristics between the conductivity type regions 32 and 34 and the electrodes 42 and 44 can be improved. That is, the insulating layer 41 may have a smaller thickness than the back passivation layer 40, the front passivation layer 24 or the anti-reflection layer 26, and may have a thickness equal to or less than that of the interlayer 20. Particularly, the insulating layer 41 may have a smaller thickness than the interlayer 20. The reason for this is that the insulating layer 41 has only to have a thin thickness to the extent that it does not degrade electrical connection characteristics.

For example, the thickness of the insulating layer 41 may be 1 nm or less (e.g., 0.005 nm to 1 nm). If the thickness of the insulating layer 41 exceeds 1 nm, electrical connection characteristics between the conductivity type regions 32 and 34 and the electrodes 42 and 44 may be slightly reduced. Furthermore, if the thickness of the insulating layer 41 is less than 0.005 nm, it may be difficult to entirely form the insulating layer 41 with a uniform thickness, and an effect by the insulating layer 41 may not be sufficient. However, the present disclosure is not limited thereto, and may include various modifications.

FIG. 3 illustrates that the insulating layer 41 together with the semiconductor layer 30 exposed by the contact hole 46 is formed entirely and consecutively while covering the surface and side of the back passivation layer 40, by way of example. In this case, the insulating layer 41 has a very thin thickness, and thus may be formed while having a step, a curve, etc. by the contact hole 46 without any change. However, the present disclosure is not limited thereto. As illustrated in FIG. 4, the insulating layer 41 may be patterned when the electrodes 42 and 44 are patterned, and thus may have the side surface that is formed only in a portion, in which the electrodes 42 and 44 are positioned, and is consecutively connected to the side of the electrodes 42 and 44 (particularly, the side surfaces of the main electrode portions 42a and 42b). Further, FIG. 3 illustrates that the insulating layer 41 is positioned only at the back surface of the semiconductor substrate 12 and prevents a change in reflection characteristics at the front surface, etc., by way of example. However, the insulating layer 41 may also be positioned at the side surface and/or front surface of the semiconductor substrate 12. Accordingly, when the electrodes 42 and 44 are patterned, the insulating layer 41 can serve to protect the side surface and/or front surface of the semiconductor substrate 12. In this instance, the insulating layer 41 may be positioned between the front surface field region 12b and the front passivation layer 24, for example, at the front surface of the semiconductor substrate 12. However, the present disclosure is not limited thereto. For example, the insulating layer 41 may be positioned between the front passivation layer 24 and the anti-reflection layer 26 or on the anti-reflection layer 26 depending on the forming order of the insulating layer 41. Alternatively, as illustrated in FIG. 5, the insulating layer 41 may not be formed, and thus the first and second electrodes 42 and 44 may contact the first and second conductivity type regions 32 and 34, respectively.

In the present embodiment, the electrodes 42 and 44 include the main electrode portion 42a positioned on (e.g., contacting) the conductivity type regions 32 and 34 and the connection electrode portion 42b positioned on the main electrode portion 42a.

In this case, the main electrode portion 42a may be made of a deposition layer (e.g., sputtering layer) formed by deposition (e.g., sputtering). More specifically, the main electrode portion 42a may include a plurality of electrode layers 421, 422, 423, and 424, and each of the plurality of electrode layers 421, 422, 423, and 423 may be made of a sputtering layer. In the present embodiment, the main electrode portion 42a may include a first electrode layer 421 positioned on the conductivity type regions 32 and 34 (e.g., contacting the insulating layer 41 or the conductivity type regions 32 and 34), and may include a second electrode layer 422, a third electrode layer 423, and a fourth electrode layer 424 that are sequentially positioned on the first electrode layer 421.

The first electrode layer 421 may serve to prevent metal materials of the second to fourth electrode layers 422, 423, and 424 (particularly, the second electrode layer 422) from undesirably reacting with the conductivity type regions 32 and 34. In this case, the insulating layer 41 may be further positioned between the conductivity type regions 32 and 34 and the first electrode layer 421. The insulating layer 41 can serve as a barrier to effectively prevent a problem attributable to the diffusion of the metal material.

More specifically, various heat treatment processes are performed during various manufacturing processes of the solar cell 10. For example, after an electrode material layer for forming the electrodes 42 and 44 is formed by a physical vapor deposition (PVD) method such as sputtering, an annealing process is performed to reduce a stress of the electrode material layer and to improve contact characteristics with the conductivity type regions 32 and 34. In a related art, a problem may occur because the semiconductor material of the conductivity type regions 32 and 34 is diffused into the second electrode layer 422 and the electrode material of the second electrode layer 422 is diffused toward the conductivity type regions 32 and 34 during such a heat treatment process. For example, because an electrode material (particularly, aluminum) of the second electrode layer 422 has a lower melting point than the semiconductor material, an electrode material positioned in the conductivity type regions 32 and 34 may easily flow out due to diffusion. Thus, a spiking phenomenon in which a small hole or a hole is formed in the conductivity type regions 32 and 34 may occur. If the spiking phenomenon occurs in the conductivity type regions 32 and 34 as described above, this means that a defect occurs in the conductivity type regions 32 and 34. Therefore, the characteristics of the conductivity type regions 32 and 34 may be greatly degraded. In the present embodiment, the above problem can be prevented by disposing the first electrode layer 421 and/or the insulating layer 41 between the conductivity type regions 32 and 34 and the second electrode layer 422.

In this instance, the first electrode layer 421 may include the same refractory metal (e.g., titanium or molybdenum) as a refractory metal contained in the metal oxide of the insulating layer 41, and the first electrode layer 421 may be made of a refractory metal layer included in the metal oxide of the insulating layer 41. Particularly, the metal of the first electrode layer 421 and the refractory metal included in the insulating layer 41 may be the same. Thus, since the same refractory metal are included in the first electrode layer 421 and the insulating layer 41, diffusion attributable to a chemical concentration gradient can be effectively prevented. For example, the insulating layer 41 may include titanium oxide, and the first electrode layer 421 may include titanium. In this case, a stable MIS contact structure can be formed due to low contact resistance and excellent thermal stability.

The second electrode layer 422 positioned on (e.g., contacting) the first electrode layer 421 may serve to improve electrical characteristics because it has a low resistance (e.g., lower resistance than the first electrode layer 421). As described above, the second electrode layer 422 may include aluminum (Al), copper (Cu), silver (Ag) or gold (Au), etc. Particularly, the second electrode layer 422 may include aluminum. If the second electrode layer 422 includes aluminum, the side of the second electrode layer 422 and the main electrode portion 42a including the second electrode layer 422 may have a cross section according to a desired pattern. On the other hand, if the second electrode layer 422 includes copper, an etchant used when patterning the main electrode portion 42a strongly etches the side of the second electrode layer 422 made of copper at a fast speed, thereby generating an under-cut in the second electrode layer 422. Hence, at least part of the side of the second electrode layer 422 is positioned more inside than the first, third and fourth electrode layers 421, 423, and 424, and thus it may be difficult to stably pattern the main electrode portion 42a in a desired shape.

The third electrode layer 423 positioned on (e.g., contacting) the second electrode layer 422 may serve as a barrier to prevent the metal material of the second electrode layer 422 from being diffused into the fourth electrode layer 424. A resistance may increase due to an alloy formed by a reaction between the metal material of the second electrode layer 422 and the metal material of the fourth electrode layer 424, and the third electrode layer 423 can prevent this. The third electrode layer 423 may include the same material (i.e., refractory metal, for example, titanium, molybdenum, or tungsten) as the first electrode layer 421.

The fourth electrode layer 424 positioned on (e.g., contacting) the third electrode layer 423 may include tin (Sn) or a nickel-vanadium alloy (NiV). Tin or nickel-vanadium alloy has a very excellent adhesion characteristic with the connection electrode portion 42b. More specifically, if the connection electrode portion 42b includes tin, adhesion characteristic between tin of the connection electrode portion 42b and nickel of the nickel-vanadium alloy is very excellent. Further, the nickel-vanadium alloy has a very high melting point of about 1000° C. or more, and thus has a higher melting point than the first to third electrode layers 421, 422, and 423. Hence, the nickel-vanadium alloy is not modified during an attaching process with the wiring portion 140 or a process of manufacturing the solar cell 10, and can sufficiently serve as a capping layer for protecting the first to third electrode layers 421, 422, and 423. However, the present disclosure is not limited thereto, and the fourth electrode layer 424 may be made of various conductive materials (e.g., various metals).

A thickness of the first electrode layer 421 may be less than a thickness of each of the second electrode layer 422 and the fourth electrode layer 424. More specifically, the thickness of the first electrode layer 421 may be 50 nm or less (e.g., 15 nm or less, for example, 2 nm to 15 nm). The reason for this is that the first electrode layer 421 can sufficiently implement the above-described effect even with a thin thickness.

The second electrode layer 422 may have a greater thickness than the first electrode layer 421, the third electrode layer 423 and/or the fourth electrode layer 424, and may have a thickness of 50 nm to 400 nm, for example. For example, the thickness of the second electrode layer 422 may be 100 nm to 400 nm (more specifically, 100 nm to 300 nm). If the thickness of the second electrode layer 422 is less than 50 nm, the second electrode layer 422 may not play the roles of a barrier layer and a reflection electrode layer. If the thickness of the second electrode layer 422 exceeds 400 nm, reflection characteristics, etc. are not greatly improved, and manufacturing cost may increase. If the thickness of the second electrode layer 422 is 100 nm to 300 nm, the resistance can be further reduced, and peeling-off attributable to a thermal stress can be effectively prevented.

The third electrode layer 423 may have a smaller thickness than each of the second electrode layer 422 and the fourth electrode layer 424. For example, the thickness of the third electrode layer 423 may be 50 nm or less. If the thickness of the third electrode layer 423 exceeds 50 nm, the resistance may relatively increase. In this case, the thickness of the third electrode layer 423 may be 5 nm to 50 nm. If the thickness of the third electrode layer 423 is less than 5 nm, the third electrode layer 423 may not be uniformly formed between the second electrode layer 422 and the fourth electrode layer 424. Hence, an effect in that a reaction between the third electrode layer 423 and the second electrode layer 422 and the fourth electrode layer 424 is prevented may not be sufficient. Alternatively, the third electrode layer 423 may have the same or similar thickness as the first electrode layer 421 or may have a greater thickness than the first electrode layer 421. However, the present disclosure is not limited thereto, and the third electrode layer 423 may have a smaller thickness than the first electrode layer 421.

The fourth electrode layer 424 may have a thickness of a nano level, for example, a thickness of 50 nm to 300 nm. If the thickness of the fourth electrode layer 424 is less than 50 nm, adhesion characteristic between the fourth electrode layer 424 and the connection electrode portion 42b may be degraded. If the thickness of the fourth electrode layer 424 exceeds 300 nm, the manufacturing cost may increase.

In the present embodiment, the first electrode layer 421, the second electrode layer 422, the third electrode layer 423 and the fourth electrode layer 424 may be formed to contact each other. Accordingly, the characteristics of the main electrode portion 42a can be improved, and the lamination structure of the main electrode portion 42a can be simplified. For example, in the present embodiment, the main electrode portion 42a may have a four-layer lamination structure including the first to fourth electrode layers 421, 422, 423, and 424. Accordingly, the lamination structure of the main electrode portion 42a can be simplified to the maximum. However, the present disclosure is not limited thereto, and the main electrode portion 42a may have a separate layer between the first to fourth electrode layers 421, 422, 423, and 424 or thereon. Furthermore, the main electrode portion 42a may not include at least one of the first to fourth electrode layers 421, 422, 423, and 424.

In the present embodiment, the main electrode portion 42a may be formed by forming a plurality of electrode material layers including the first to fourth electrode layers 421, 422, 423, and 424 by sputtering and then patterning the plurality of electrode material layers. More specifically, after electrode material layers corresponding to the first to fourth electrode layers 421, 422, 423, and 424 are entirely sequentially formed to fill the contact hole 46 of the back passivation layer 40, the main electrode portion 42a may be formed by patterning the electrode material layers. Since the corresponding materials are stacked in a thickness direction of the solar cell 10 by the sputtering as described above, the corresponding materials are stacked so that the first electrode layer 421 has a uniform thickness in the entire portion, the second electrode layer 422 has a uniform thickness in the entire portion, the third electrode layer 423 has a uniform thickness in the entire portion, and the fourth electrode layer 424 has a uniform thickness in the entire portion. Here, the uniform thickness may indicate a thickness (e.g., a thickness having a difference within 10%) which may be determined to be uniform when considering a process error, etc.

If each of the first to fourth electrode layers 421, 422, 423, and 424 is formed by sputtering as described above, it may be formed of a single metal layer (all the remainders other than inevitable impurities are single metal) including a single metal which may be included in each of the electrode layers 421, 422, 423, and 424. Accordingly, each of the first to fourth electrode layers 421, 422, 423, and 424 may include a single metal of 99.9 wt % or more (more specifically, 99.99 wt % or more) which may be included in each of the electrode layers 421, 422, 423, and 424. However, the present disclosure is not limited thereto, and content of the single metal of each of the first to fourth electrode layers 421, 422, 423, and 424 may be changed depending on a manufacturing method, process conditions, etc. of the first to fourth electrode layers 421, 422, 423, and 424. Further, the material, thickness, lamination structure, etc. of each of the first to fourth electrode layers 421, 422, 423, and 424 may also be variously changed.

In the present embodiment, the connection electrode portion 42b formed of a printing layer by printing may be positioned on the main electrode portion 42a formed of the sputtering layer. For example, the connection electrode portion 42b may contact the main electrode portion 42a (more specifically, the fourth electrode layer 424). In the present embodiment, a density of the connection electrode portion 42b that forms the outermost layer of the electrodes 42 and 44 and is formed of the printing layer is less than a density of the main electrode portion 42a formed of the sputtering layer.

In the present embodiment, the connection electrode portion 42b may serve as an electrode for collecting and transmitting electric current with a low electrical resistance, and as a solder paste for adhesion to the wiring member 142 by including a solder material and an adhesive material. That is, the connection electrode portion 42b may be a solder paste electrode that serves both as an electrode for improving electrical characteristics and as a solder paste for adhesion to the wiring member 142. Hence, the present embodiment does not require a separate solder paste layer for electrical connection (for example, high temperature firing paste, e.g., high temperature firing paste soldered by heat treatment at a temperature exceeding 280° C.). Thus, the wiring member 142 may be directly connected to the connection electrode portion 42b (particularly, a cover layer 428) or directly positioned on an adhesive layer LSP positioned at (e.g., contacting) the connection electrode portion 42b (particularly, a cover layer 428), and may be connected to the electrodes 42 and 44. This is described in detail later with reference to FIGS. 7 and 8. Here, the adhesive layer LSP may be formed on a plurality of insulating members IP and the plurality of electrodes 42 and 44 along the extension direction of the wiring member 142 correspondingly to the wiring member 142 so that the adhesive layer LSP is attached or temporarily fixed to the wiring member 142. The adhesive layer LSP may be distinguished from the connection electrode portion 42b formed corresponding to each of the electrodes 42 and 44 or a related art solder paste layer. The adhesive layer LSP may be formed of a low temperature solder paste. For example, the adhesive layer LSP may have a lower melting temperature than the connection electrode portion 42b or the related art solder paste layer.

Hence, in the present embodiment, the connection electrode portion 42b may be formed of a paste (metal material paste) including a first metal, a solder material including a second metal different from the first metal, and an adhesive material. More specifically, the connection electrode portion 42b may include a particle connection layer 426 formed by connecting (e.g., contacting) a plurality of particles 426a including the first metal to each other, and a cover layer 428 including the second metal and formed while covering at least an outer surface of the particle connection layer 426. The adhesive material or a part thereof may be removed in the heat treatment process, etc., and the adhesive material or a part of the material constituting the same may remain or may not remain in the connection electrode portion 42b in the final structure. In addition, other organic material, etc. may further remain. Whether the adhesive material or the material constituting the same remains may be determined by various component analysis methods, micrographs, and the like.

Here, the first metal may be for reducing the resistance of the connection electrode portion 42b and the electrodes 42 and 44 including the same, the second metal or the solder material may be for soldering with the wiring portion 140, and the adhesive material may serve to improve adhesion between the connection electrode portion 42b and the wiring portion 140. The cover layer 428 or the second metal constituting the same may serve to prevent oxidation of the metal constituting the particle connection layer 426, and to assist in the connection of the particles 426a in the particle connection layer 426, etc.

The first metal included in the connection electrode portion 42b may be the material of the respective electrode layers 421, 422, 423 and 424 of the main electrode portion 42a or a metal having a resistivity equal to or less than a resistivity of the second metal. In particular, the first metal may be the material of the respective electrode layers 421, 422, 423 and 424 of the main electrode portion 42a or a metal having a resistivity less than a resistivity of the second metal. For example, copper, silver, aluminum, gold, etc. may be used as the first metal, but titanium (Ti) having a high resistivity may not be used. In particular, the first metal may be copper which has a very low resistivity and is inexpensive.

The solder material including the second metal may be a material that enables soldering. For example, the second metal may be tin (Sn), and the solder material may consist of only the second metal or may be an alloy further including other metal. For example, soldering characteristics may be further improved by using a tin-silver-copper (Sn—Ag—Cu, SAC)-based alloy as a solder material. In this case, the solder material may include tin as a main material (a material of 50 vol % or more), and silver and copper may be included in an amount less than that of tin. Since the second metal includes the same material as the solder metal (e.g., tin) included in the wiring portion 140 as described above, contact characteristics and adhesion characteristics with the wiring portion 140 can be greatly improved. The second metal or the solder material has a lower melting point than that of the first metal, and thus may be easily melted in the heat treatment process and then aggregated. Thus, the cover layer 428 can be stably formed on the outer surface of the connection electrode portion 42b and serve to physically and electrically connect the particles 426a including the first metal. Since the second metal including tin has a lower ionization tendency or lower metal reactivity than the first metal, it may also serve to prevent oxidation of the first metal or the particle connection layer 426.

The adhesive material may include an organic material, an inorganic material, etc. as a material capable of improving soldering characteristics, and may have non-conductive properties. For example, the adhesive material may be a material including both an organic material and an inorganic material, for example, a flux including carbon, oxide, rosin, etc. The flux may include carbon, oxide, rosin, etc., and serve to improve adhesion characteristics between the connection electrode portion 42b and the wiring portion 140 during soldering. In addition, the flux may include an additive for effective dispersion. However, the present disclosure is not limited thereto, and various materials capable of improving the adhesion characteristics of the wiring portion 140 may be used as the adhesive material.

The paste including the first metal, the solder material including the second metal, and the adhesive material will be described in more detail later in the description of the method for manufacturing the solar cell panel 100.

The connection electrode portion 42b may form a part of an electrode using a solder paste that has been used for the attachment between the electrodes 42 and 44 and the wiring member 142 in the related art. The connection electrode portion 42b may be considered as a solder paste in which the first metal for lowering a resistance is added to a material constituting the related art solder paste. Alternatively, the connection electrode portion 42b may be considered as an electrode portion to which an adhesive material is added to an existing electrode portion together with a solder material. Hence, the connection electrode portion 42b may be considered as a solder paste electrode that serves as an electrode having excellent electrical characteristics and as a solder paste having an excellent adhesive force to the wiring portion 140. In addition, an adhesive force with the main electrode portion 42a can be greatly improved by the adhesive material.

The particle connection layer 426 includes the plurality of particles 426a including the first metal having a low resistivity, and may serve to reduce the resistance of the electrodes 42 and 44. The particle connection layer 426 may be a layer formed by a plurality of particles which is hardened at a lower melting point than a melting point of the first metal and then is aggregated and connected (e.g., cross-linked) in the thickness direction and/or plane direction of the electrodes 42 and 44. For example, the plurality of particles of the particle connection layer 426 may be physically and electrically connected by a direct contact or may be physically and electrically connected through the cover layer 428 or remaining portions 428a and 428b, or a binder that is positioned between the plurality of particles or over the plurality of particles. The particle connection layer 426 is a layer interconnected by hardening. Accordingly, in the heat treatment for forming the particle connection layer 426, the first metal does not melt at a melting point or more and is not sintered, and thus there is no necking phenomenon in which a part of the particles is deformed and is combined. Hence, a plurality of particles 426b having a substantially spherical shape remain in the state in which they have contacted and connected each other, and thus a shape of a curved surface having uneven curves along partial surfaces of the plurality of particles 426a is formed on the outer surface of the particle connection layer 426 (i.e., a surface not contacting the main electrode portion 42a or a surface covered by the cover layer 428). For example, the outer surface of the particle connection layer 426 may have a shape of a curved surface having a plurality of concave parts corresponding to the portions of the substantially spherical shape.

For example, the plurality of particles 426a may have an average particle diameter of 2 um or more (for example, 2 μm to 15 μm). It may have a difficulty in forming the particles 426a having the average particle diameter less than 2 μm. If the average particle diameter of the particles 426a exceeds 15 μm, it may be difficult to form the electrodes 42 and 44 to a desired thin width. Alternatively, the average particle diameter of the plurality of particles 426a may be greater than a thickness of the respective electrode layers 421, 422, 423 and 424 constituting the main electrode portion 42a. For example, the average particle diameter of the plurality of particles 426a may be equal to or greater than (particularly, may be greater than) a total thickness of the main electrode portion 42a. When the plurality of particles 426a have the average particle diameter of a predetermined level as described above, the resistance of the connection electrode portion 42b can be efficiently reduced. However, the present disclosure is not limited thereto.

The cover layer 428 includes the second metal and is formed to cover at least the outer surface of the particle connection layer 426. If the second metal has a lower melting point than the first metal, the particles can easily melt at a relatively low temperature and can be easily aggregated. Thus, the second metal may flow out between the plurality of particles 426a including the first metal in a heat treatment process and may be aggregated at the outer surface of the particle connection layer 426 to form a layer shape, thereby forming the cover layer 428. The cover layer 428 may be formed to entirely and consecutively cover the outer surface of the particle connection layer 426. Hence, the cover layer 428 can effectively serve to prevent a change in characteristics (e.g., oxidization), etc. of the particle connection layer 426 and to protect the particle connection layer 426. Furthermore, if the second metal forming the cover layer 428 is includes a material included in a solder material, contact characteristics with the wiring portion 140, etc. can be improved.

Here, the cover layer 428 may be formed to fill a space between the plurality of particles 426a formed of the first metal. Furthermore, the remaining portions 428a and 428b including the same second metal as the cover layer 428 may be spaced apart from the cover layer 428 and may be further positioned between the plurality of particles 426a or at a boundary surface adjacent to the main electrode portion 42a. The remaining portions 428a and 428b may include the first remaining portion 428a that is spaced apart from the cover layer 428 and is positioned between the plurality of particles 426a, and the second remaining portion 428b that is partially formed at the boundary surface adjacent to the main electrode portion 42a and has a smaller thickness than the cover layer 428.

In the present embodiment, in the connection electrode portion 42b, a volume ratio of the first metal may be equal to or less than a volume ratio of the second metal. For example, in the connection electrode portion 42b, the volume ratio of the first metal may be less than the volume ratio of the second metal. Hence, a sufficient amount of the second metal involved in soldering can be included in the connection electrode portion 42b to improve adhesion characteristics with the wiring portion 140. However, the present disclosure is not limited thereto. For example, in the connection electrode portion 42b, the volume ratio of the first metal may be greater than the volume ratio of the second metal.

A thickness of the particle connection layer 426 may be less than a thickness of the cover layer 428, or may be equal to the thickness of the cover layer 428, or may be greater than the thickness of the cover layer 428. For example, since a larger volume ratio of the second metal is included, the thickness of the cover layer 428 may be equal to or greater than the thickness of the particle connection layer 426. The outer surface of the particle connection layer 426 may be formed as a curved surface having uneven curves by the shape of the plurality of particles. In this instance, a second thickness T2 of the cover layer 428 may be greater than a surface roughness R1 of the outer surface of the particle connection layer 426 (i.e., a distance between a most protruding portion and a least protruding portion protruding from the outer surface of the particle connection layer 426 to the outside). Thus, the cover layer 428 can stably cover the particle connection layer 426. Furthermore, the outer surface of the cover layer 428 may have a smaller surface roughness than the outer surface of the particle connection layer 426. Hence, adhesive stability with the wiring portion 140 can be further improved by reducing the surface roughness of the connection electrode portion 42b at a surface to which the wiring portion 140 is attached.

As described above, the connection electrode portion 42b is comprised of a printing layer formed by printing, and the particle connection layer 426 may also be formed to have a sufficient thickness. Thus, resistance can be effectively reduced by the low resistivity of the first metal.

When viewed in the second direction (x-axis direction in the drawing) intersecting the first direction (y-axis direction in the drawing) in which the electrodes 42 and 44 extend, a width (e.g., maximum width) of the connection electrode portion 42b may be equal to or less than a width (e.g., maximum width) of the main electrode portion 42a. However, the present disclosure is not limited thereto. When viewed in the second direction, a width (e.g., maximum width) of the connection electrode portion 42b may be greater than a width (e.g., maximum width) of the main electrode portion 42a.

For example, a ratio of the width (e.g., maximum width) of the connection electrode portion 42b to the width (e.g., maximum width) of the main electrode portion 42a may be equal to or greater than 0.5 (e.g., 0.8 to 1.5). If the ratio is less than 0.5, a resistance reduction effect resulting from the connection electrode portion 42b may not be sufficient. If the ratio is equal to or greater than 0.8, a resistance reduction effect resulting from the connection electrode portion 42b may be sufficiently implemented. If the ratio exceeds 1.5, problems such as a reduction in structural stability and insulation properties may occur by the connection electrode portion 42b formed in addition to the main electrode portion 42a. However, the present disclosure is not limited thereto.

When viewed in the second direction, the electrodes 42 and 44 may be formed to have a greater width than the contact hole 46. This is to reduce a resistance of the electrodes 42 and 44 by sufficiently securing the widths of the first and second electrodes 42 and 44 (i.e., the greatest width of widths of the portions constituting the electrodes 42 and 44). Accordingly, the electrodes 42 and 44 (particularly, the first electrode layer 421) may be formed over the insulating layer 41 positioned inside (i.e., on the bottom surface and the side) the contact hole 46 and over the insulating layer 41 positioned on the back passivation layer 40 adjacent to the contact hole 46. If the insulating layer 41 is not included, the electrodes 42 and 44 (particularly, the first electrode layer 421) may be formed on the conductivity type regions 32 and 34 exposed through the inside of the contact hole 46 and on the side and the surface of the back passivation layer 40 adjacent to the contact hole 46.

The connection electrode portion 42b may have a greater thickness than the main electrode portion 42a. The connection electrode portion 42b is a layer for reducing resistance of the electrodes 42 and 44 and may be formed to have a sufficient thickness in order to effectively reduce the resistance. For example, a ratio of the thickness (e.g., average thickness) of the connection electrode portion 42b to the thickness (e.g., average thickness) of the main electrode portion 42a may be 10 times or more. For example, a ratio of the thickness of the connection electrode portion 42b to the thickness of the main electrode portion 42a may be 10 times to 250 times. If the ratio is 10 times or more, a resistance reduction effect by the thickness of the connection electrode portion 42b can be maximized. If the ratio exceeds 250 times, there may be a problem in that the structural stability of the electrodes 42 and 44 is reduced. Alternatively, the thickness of the main electrode portion 42a may be 1 µm or less (e.g., 600 nm or less), and the thickness of the connection electrode portion 42b may be 5 µm or more (e.g., 10 µm to 100 µm, more specifically, 10 µm to 50 µm). The present disclosure can simplify the manufacturing process while maximizing the effect by the main electrode portion 42a and the connection electrode portion 42b within the range and can prevent a reduction in the structural stability of the electrodes 42 and 44.

As described above, in the present embodiment, the connection electrode portion 42b may be formed as a part of the electrode by coating, drying and curing the paste (e.g., solder paste) including both the solder material including the first metal and the second metal and the adhesive material on the main electrode portion 42a. Hence, the present disclosure can effectively reduce the resistance of the connection electrode portion 42b and the electrodes 42 and 44 including the connection electrode portion 42b by forming the connection electrode portion 42b to a sufficient thickness while simplifying the manufacturing process. A method of manufacturing the connection electrode portion 42b using the paste including the first metal, the solder material, and the adhesive material is described in more detail later with reference to FIGS. 9a to 9f and 10.

On the contrary, when an electrode layer including a first metal and an electrode layer that is formed on the electrode layer and includes a second metal for connection with a wiring portion are separately formed, the electrode layers need to be sequentially formed inside a vacuum equipment in order to prevent the oxidization of the first metal. Accordingly, a process becomes complicated, and there is a difficulty in forming the electrode layers (particularly, the electrode layer including the first metal) to a sufficient thickness. On the other hand, in the present embodiment, a process can be simplified and the connection electrode portion 42b can be formed to a sufficient thickness by applying a printing process using a paste including both a first metal and a second metal. Particularly, the connection electrode portion 42b including the particle connection layer 426 formed by connecting the plurality of particles including the first metal may be formed by heat treatment having a relatively low temperature (e.g., 450° C. or less).

There is no problem of degradation in the characteristics of the conductivity type regions 32 and 34 or a damage to the conductivity type regions 32 and 34 in a process of forming the electrodes 42 and 44.

Unlike the present embodiment, if an electrode is comprised of only a printing layer, the electrode is comprised of only a layer with low density, and thus contact characteristics between the electrode and the conductivity type regions 32 and 34 may not be excellent and the electrode may be easily peeled off from the conductivity type regions 32 and 34. Furthermore, in order to connect the electrode comprised of the printing layer to the conductivity type regions 32 and 34, heat treatment at a high temperature (e.g., 700° C. or more) is necessary since a firing or sintering process is necessary. Accordingly, the characteristics of the conductivity type regions 32 and 34 may be changed because a dopant included in the conductivity type regions 32 and 34 is undesirably diffused or activated during the heat treatment process, and there may be a problem, such as that the conductivity type regions 32 and 34 is damaged due to a high temperature.

Furthermore, unlike the present embodiment, if an electrode is comprised of only a sputtering layer, it may be difficult to form the electrode to a sufficient thickness (e.g., exceeding 1 μm). If a process time greatly increases in order to form the electrode to a sufficient thickness, there is a problem in that the characteristics of the conductivity type regions 32 and 34 are degraded when the electrode is formed. Hence, there is a limit to a reduction in a resistance of the electrode.

Furthermore, unlike the present embodiment, if an electrode includes a plating layer, the plating layer needs to be formed through plating after a sputtering layer, a printing layer, etc. are formed. In this case, a density of the plating layer is similar to a density of the sputtering layer and is higher than a density of the printing layer. Thus, the density of the plating layer positioned at the outside is equal to or higher than the densities of the sputtering layer, the printing layer, etc. positioned at the inside. If the plating layer is included as in the related art, the plating layer is also formed on the side of the sputtering layer, the printing layer, etc. and on the insulating layer around them. If a defect, such as a pin hole or a scratch, is present in the back passivation layer 40 or the insulating layer 41, an unwanted portion may be plated because plating is also performed on the corresponding portion. Since a plating solution used in the plating process is acid or alkali, the back passivation layer 40 or the insulating layer 41 may be damaged or the characteristics of the back passivation layer 40 or the insulating layer 41 may be degraded. Hence, passivation characteristics may be degraded, and an open-circuit voltage of the solar cell 10 may be reduced because a leakage current occurs. When various forms of electrode portions are mixed and used as in the related art as described above, a density of an electrode portion forming the outermost layer is equal to or higher than a density of an electrode portion underlying the electrode portion forming the outermost layer as described above. Hence, the related art is different from the present embodiment in which a printing layer with the low density is positioned at the outside and a sputtering layer with the high density is positioned at the inside.

For another example, if both a printing layer and a plating layer are formed, the stability of an electrode may not be good and it may be difficult to stably attach the wiring portion 140 to the electrode, because a height of the electrode is excessively high. Particularly, as in the present embodiment, in a structure in which both the electrodes 42 and 44 are positioned on one surface (i.e., the back surface) of the semiconductor substrate 12, and the wiring portion 140 is extended in a direction intersecting the electrodes 42 and 44 and needs to be connected to only a desired one of the electrodes 42 and 44 and should not be connected to the other of the electrodes 42 and 44, it may be difficult to stably attach the wiring portion 140 to an electrode in which both a printing layer and a plating layer are formed. For reference, it is technically less likely that the sputtering layer is formed on the plating layer, which is not advantageous in terms of the process.

In the present embodiment, as described above, the connection electrode portion 42b may be formed as the printing layer and may be formed to have a desired shape when the connection electrode portion 42b is formed. The printing layer has a pattern and may be formed only in a desired portion. Accordingly, the present embodiment can fundamentally prevent problems such as a leakage current, deterioration in passivation characteristics, and a reduction in an open-circuit voltage that may occur when the electrode is formed in an undesired portion due to the printing layer.

In this instance, an intermetallic compound (IMC) layer 420, in which a metal included in the main electrode portion 42a (particularly, the fourth electrode layer 424) and the second metal are mixed, may be positioned between the main electrode portion 42a and the connection electrode portion 42b. For example, the intermetallic compound layer 420 may be a compound layer in which a nickel-vanadium (Ni—V) alloy and tin (Sn) are mixed. The intermetallic compound layer 420 may be formed in the heat treatment process performed after the printing layer for forming the connection electrode portion 42b is formed, and may serve to improve adhesion characteristics between the main electrode portion 42a and the connection electrode portion 42b. For example, in the present embodiment, a sufficient amount of the second metal is contained in the connection electrode portion 42b, and the intermetallic compound layer 420 can be stably formed. Here, a thickness of the intermetallic compound layer 420 may be 1 nm or more (for example, 20 nm to 500 nm). The present embodiment may not change other characteristics while maximizing an effect of the intermetallic compound layer 420 within the thickness.

A laminated structure, a plane shape, etc. of the main electrode portion 42a and the connection electrode portion 42b are described later after the wiring portion 140 is described.

In the present embodiment, the first and second electrodes 42 and 44 each may include the main electrode portions 42a and 44a and the connection electrode portions 42b and 44b. The first and second electrodes 42 and 44 each may further include the intermetallic compound layer 420 between the main electrode portions 42a and 44a and the connection electrode portions 42b and 44b. The manufacturing process can be simplified by simultaneously forming the main electrode portions 42a and 44a and the connection electrode portions 42b and 44b of the first and second electrodes 42 and 44 in the same process. However, the present disclosure is not limited thereto. For example, one of the first and second electrodes 42 and 44 may have the above-described structure, and the other may have a different structure. Other modifications can be used.

100 or more portions (e.g., the first and second electrodes 42 and 44) of the first and second electrodes 42 and 44 including the connection electrode portions 42b and 44b extended in the first direction (the y-axis direction in the drawing) and including copper and tin as described above (more specifically, the connection electrode portions 42b and 44b each including the particle connection layer 426 including copper and the cover layer 428 covering the particle connection layer 426) may be positioned on one surface of the semiconductor substrate 10. Accordingly, carriers can be stably collected and transmitted because a carrier moving distance can be reduced. In this case, as described above, the thickness of the connection electrode portions 42b and 44b extended in one direction and including copper and tin (more specifically, the connection electrode portions 42b and 44b including the particle connection layer 426 including copper and the cover layer 428 covering the particle connection layer 426) or the thickness of the first, second electrodes 42 and 44 including the connection electrode portions 42b and 44b may be 5 μm or more (for example, 10 μm or more). However, the present disclosure is not limited thereto.

The solar cell 10 is electrically connected to other solar cell or the outside by the wiring portion 140 including the wiring member 142. Hereinafter, a connection structure of the solar cell 10 and the wiring portion 140 is described in more detail with reference to FIGS. 6 and 7.

FIG. 6 is a rear plan view schematically illustrating two solar cells 10, an insulating member IP, and a wiring portion 140 included in the solar cell panel 100 illustrated in FIG. 1. FIG. 7 is a partial cross-sectional view taken along line VII-VII of FIG. 6. FIGS. 6 and 7 schematically illustrate the structure of the electrodes 42 and 44 focusing on the connection structure of the electrodes 42 and 44 and the wiring portion 140 in order to describe the connection structure of the electrodes 42 and 44 of the solar cell 10 and the wiring portion 140, by way of example. Thus, the present embodiment is not limited to the number, the shape, etc. of the electrodes 42 and 44 and the wiring member 142 illustrated in FIGS. 6 and 7.

Referring to FIGS. 6 and 7, in the present embodiment, in a plurality of overlap portions of the electrodes 42 and 44 and the wiring portions 140, in an overlap portion in which the electrodes 42 and 44 and the wiring portions 140 need to be electrically connected to each other, the electrodes 42 and 44 (the connection electrode portions 42b and 44b) and the wiring portions 140 contact each other and are connected with an adhesive layer LSP interposed therebetween. Further, in an overlap portion in which the electrodes 42 and 44 and the wiring portions 140 do not need to be electrically connected to each other, an insulating member IP is positioned between the electrodes 42 and 44 and the wiring portions 140. Hence, a separately positioned connection member (e.g., the related art solder paste layer) may be omitted between the electrodes 42 and 44 and the wiring portions 140.

More specifically, the first electrode 42 of the first solar cell 10a and the second electrode 44 of the second solar cell 10b adjacent to it may be connected by the plurality of wiring members 142 and the connecting wiring member 144.

In the present embodiment, the electrodes 42 and 44 may include a plurality of first and second electrodes 42 and 44 that extend in the first direction (y-axis direction in the drawing) and are alternately positioned in a direction (x-axis direction in the drawing) intersecting the first direction. The wiring member 142 may include a first wiring member 142a extending in the second direction and electrically connected to the first electrode 42 and a second wiring member 142b extending in the second direction and electrically connected to the second electrode 44. A plurality of first wiring members 142a may be provided, and a plurality of second wiring members 142b may be provided, and the first wiring members 142a and the second wiring members 142b may be alternately positioned in the first direction. Then, the plurality of first and second wiring members 142a and 142b may be connected to the first and second electrodes 42 and 44 at uniform intervals to effectively transfer the carriers.

In this instance, the first wiring member 142a is electrically connected to the first electrode 42 included in each solar cell 10 with the adhesive layer LSP disposed therebetween, and the second wiring member 142b directly contact the second electrode 44 included in each solar cell 10 and is electrically connected to the second electrode 44 with the adhesive layer LSP disposed therebetween. In addition, the first wiring member 142a and the second electrode 44 may be insulated from each other by the insulating member IP, and the second wiring member 142b and the first electrode 42 may be insulated from each other by the insulating member IP.

The insulating member IP may be positioned in the overlap portion of the first wiring member 142a and the second electrode 44, which should not be at least electrically connected to each other, and may electrically insulate them. Similarly, the insulating member IP may be positioned in the overlap portion of the second wiring member 142b and the first electrode 42 which should not be at least electrically connected to each other, and may electrically insulate them. The insulating member IP may include various insulating materials. For example, the insulating member IP may include silicone resin, epoxy resin, urethane resin, acrylic resin, polyimide, polyethylene, or the like.

In the present embodiment, the connection electrode portion 42b may be formed on the main electrode portion 42a in various plane shapes.

For example, as illustrated in the enlarged view of FIG. 6, the main electrode portions 42a and 44a may continuously elongate along the first direction (y-axis direction in the drawing), and the connection electrode portions 42b and 44b may be partially formed on a part of the main electrode portions 42a and 44a in the first direction and may not be formed on other part. In this instance, the connection electrode portions 42b and 44b may be formed to include partially or entirely an overlap portion of the electrodes 42 and 44 and the wiring portion 140 that have to be electrically connected to each other. For example, the plurality of connection electrode portions 42b and 44b may be provided to be spaced apart from each other at a predetermined distance in the first direction.

More specifically, as illustrated in FIG. 7, the main electrode portion 42a of the first electrode 42 may continuously elongate along the first direction, and the plurality of insulating members IP may be positioned on the main electrode portion 42a to be spaced apart from each other in the first direction. The plurality of insulating members IP may be positioned in an overlap portion of the insulating member IP and the second wiring member 142b. Further, the connection electrode portion 42b may be positioned on the main electrode portion 42a to include a portion, in which the plurality of insulating members IP are not positioned, i.e., a portion overlapping at least the first wiring member 142a. Here, the connection electrode portion 42b in the first direction may be the same as a portion overlapping the first wiring member 142a or may have a greater length than the portion. In particular, the connection electrode portion 42b in the first direction may have a greater length than a portion overlapping the first wiring member 142a. However, the present disclosure is not limited thereto. For example, the connection electrode portion 42b in the first direction may have a smaller length than a portion overlapping the first wiring member 142a. In this instance, the connection electrode portion 42b may be positioned to be spaced apart from the plurality of insulating members IP in the first direction. Hence, the present disclosure can simplify the manufacturing process of the connection electrode portion 42b and reduce the material cost by reducing an area of the connection electrode portion 42b.

Similar to this, the main electrode portion 44a of the second electrode 44 may continuously elongate along the first direction, and the plurality of insulating members IP may be positioned on the main electrode portion 44a to be spaced apart from each other in the first direction. The plurality of insulating members IP may be positioned in an overlap portion of the insulating member IP and the first wiring member 142a. Further, the connection electrode portion 44b may be positioned on the main electrode portion 44a to include a portion, in which the plurality of insulating members IP are not positioned, i.e., a portion overlapping at least the second wiring member 142b. Here, the connection electrode portion 44b in the first direction may be the same as a portion overlapping the second wiring member 142b or may have a greater length than the portion. In particular, the connection electrode portion 44b in the first direction may have a greater length than a portion overlapping the second wiring member 142b. However, the present disclosure is not limited thereto. For example, the connection electrode portion 44b in the first direction may have a smaller length than a portion overlapping the second wiring member 142b. In this instance, the connection electrode portion 44b may be positioned to be spaced apart from the plurality of insulating members IP in the first direction. Hence, the present disclosure can simplify the manufacturing process of the connection electrode portion 44b and reduce the material cost by reducing an area of the connection electrode portion 44b.

FIG. 7 and the above description have illustrated and described that the adhesive layer LSP is positioned between the connection electrode portions 42b and 44b and the wiring member 142. For example, the adhesive layer LSP between the connection electrode portions 42b and 44b and the wiring member 142 may contact the connection electrode portions 42b and 44b and the wiring member 142. Hence, the adhesive layer LSP may serve to temporarily fix the connection electrode portions 42b and 44b and the wiring member 142 and to stably attach the connection electrode portions 42b and 44b and the wiring member 142.

For the simple illustration and the clear understanding, in the present disclosure, in the cross-sectional view of the drawing, for example, FIG. 7, the adhesive layer LSP is positioned on only the connection electrode portions 42b and 44b and is positioned on the insulating member IP. However, the adhesive layer LSP may actually have a straight shape in which it elongates along the second direction and is formed over the plurality of connection electrode portions 42b and 44b and the plurality of insulating members IP along the extension direction of the wiring member 142. However, the present disclosure is not limited thereto, and the shape, the arrangement, etc. of the adhesive layer LSP may be variously changed.

For another example, as illustrated in FIG. 8, in a plurality of overlap portions of the electrodes 42 and 44 and the wiring portions 140, in an overlap portion in which the electrodes 42 and 44 and the wiring portions 140 need to be electrically connected to each other, the electrodes 42 and 44 (the connection electrode portions 42b and 44b) and the wiring portions 140 may directly contact each other and may be connected. More specifically, the first wiring member 142a may directly contact the first electrode 42 included in each solar cell 10 and may be electrically connected to the first electrode 42, and the second wiring member 142b may directly contact the second electrode 44 included in each solar cell 10 and may be electrically connected to the second electrode 44.

A method of manufacturing the solar cell 10 having the above-described structure and the solar cell panel 100 including the same is described in detail below with reference to FIGS. 9a to 9f and FIG. 10 along with FIGS. 1 to 8. FIGS. 9a to 9f are cross-sectional views partially illustrating a method for manufacturing the solar cell panel 100 according to an embodiment of the present disclosure. FIG. 10 schematically illustrates metal particles 426b included in a paste used for forming the connection electrode portion 42b in a method for manufacturing the solar cell panel 100 according to an embodiment of the present disclosure. A detailed description of the part that has been already described above is omitted, and an undescribed part is chiefly described in detail.

Referring to FIG. 9a, the interlayer 20, the first conductivity type region 32, the second conductivity type region 34, the barrier region 36, the back passivation layer 40, the insulating layer 41, etc. are formed on the back surface of the semiconductor substrate 12, and the front surface field region 12b, the front passivation layer 24, the anti-reflection layer 26, etc. are formed on the front surface of the semiconductor substrate 12 to form a photoelectric conversion unit. In this case, the contact hole 46 has been formed in the back passivation layer 40 in accordance with a portion where an electrode (42 and 44 in FIG. 9c, hereinafter the same) will be formed.

The order, method, etc. for forming the interlayer 20, the first conductivity type region 32, the second conductivity type region 34, the barrier region 36, the back passivation layer 40, the insulating layer 41, the front surface field region 12b, the front passivation layer 24, the anti-reflection layer 26, etc. may be changed in various ways.

For example, various processes known as the texturing of the semiconductor substrate 12 may be used. The interlayer 20 or the insulating layer 41 may be formed by a thermal growth method, a deposition method (e.g., plasma enhanced chemical vapor deposition (PECVD) or an atomic layer deposition (ALD) method), etc. The first and second conductivity type regions 32 and 34 may be formed by doping a dopant into a semiconductor layer formed by a thermal growth method, a deposition method (e.g., low pressure chemical vapor deposition (LPCVD)), etc. The doping of the dopant may be performed in a process of forming the semiconductor layer or may be performed in a doping process performed after the semiconductor layer is formed. The front surface field region 12b may be formed by various doping processes. An ion implantation method, a thermal diffusion method, a laser doping method, etc. may be performed as the doping process. The front passivation layer 24, the anti-reflection layer 26 or the back passivation layer 40 may be formed by various methods, such as a chemical vapor deposition method, a vacuum deposition method, a spin coating method, a screen printing method, and a spray coating method. The contact hole 46 may be formed by various methods, such as laser etching and wet etching.

Next, as illustrated in FIGS. 9b to 9d, the first and second electrodes 42 and 44 including the main electrode portions 42a and 44a and the connection electrode portions 42b and 44b may be formed. The first and second electrodes 42 and 44 may be formed to fill the contact hole 46. For example, in the present embodiment, a step of forming the insulating member IP is performed between a step of forming the main electrode portions 42a and 44a and a step of forming the connection electrode portions 42b and 44b. This is described in detail below.

As illustrated in FIG. 9b, the main electrode portions 42a and 44a may be formed on the conductivity type regions 32 and 34 to fill the contact hole 46. The main electrode portions 42a and 44a may be formed by sputtering.

The main electrode portions 42a and 44a of the first and second electrodes 42 and 44 may be formed by performing the sputtering on the semiconductor substrate 12 and the conductivity type regions 32 and 34 (or the insulating layer 41 positioned on the conductivity type regions), sequentially forming entirely a plurality of material electrode layers on the semiconductor substrate 12 and the conductivity type regions 32 and 34 (or the insulating layer 41 formed on the conductivity type regions) and the plurality of electrode material layers, and then patterning them. The patterning method may be performed using an etchant, an etching paste, and dry etching, etc. For example, the main electrode portions 42a and 44a may be patterned by applying a resist paste on a portion where the main electrode portions 42a and 44a need to be formed, and etching a remaining portion using an etchant. Thereafter, the resist paste is removed. Other various methods can be used.

Next, as illustrated in FIG. 9c, the insulating member IP is formed. The insulating member IP may be formed to have a desired pattern by the printing, etc.

Next, as illustrated in FIG. 9d, the connection electrode portions 42b and 44b are formed on the main electrode portions 42a and 44a. The connection electrode portions 42b and 44b may be formed by the printing. As illustrated in FIG. 9e, the adhesive layer LSP is formed on the connection electrode portions 42b and 44b. As illustrated in FIG. 9f, the wiring member 142 is positioned on the electrodes 42 and 44 and the insulating member IP to attach the wiring portion 140.

More specifically, the connection electrode portions 42b and 44b may be formed by coating a paste forming the connection electrode portions 42b and 44b on the main electrode portions 42a and 44a, drying the paste, and performing a heat treatment on the dried paste to anneal it.

The paste forming the connection electrode portion 42b may include metal particles 426b including a first metal, a solder material including a second metal different from the first metal, an adhesive material, and the like. In addition, the past may further include a solvent, an additive, etc. In the present embodiment, since the connection electrode portions 42b and 44b do not require the fire-through passing through the insulating layer, they do not include a glass frit.

The metal particles 426b included in the paste and including the first metal may include various materials or various shapes. That is, as illustrated in (a) of FIG. 10, the metal particles 426b may be particles formed of the first metal. Alternatively, as illustrated in (b) of FIG. 10, the metal particles 426b may include a core layer 4260 including the first metal, and a coating layer 4280 that is coated on the core layer 4260 and includes an organic material or a metal (e.g., tin) different from copper. For example, the metal particles 426b may include copper particles, copper particles coated with an organic material, or copper particles coated with a different metal (e.g., tin) from copper.

If the metal particles 426b use particles formed of the first metal, they can reduce the material cost and have a low resistivity.

If the metal particles 426b use copper particles coated with an organic material, they can prevent oxidation in advance and prevent electrical conductivity from being greatly reduced, and thus may not affect the efficiency of the solar cell 10. For example, if the metal particles 426b are copper particles coated with an organic material, when a total volume of the metal particles 426b is 100, a volume ratio of the coating layer 4280 may be 15 to 30. This is in consideration of electrical conductivity, etc., but the present disclosure is not limited thereto.

If the metal particles 426b use copper particles coated with a different metal (e.g., tin), they can improve connection characteristics with the main electrode portions 42a and 44a and the wiring member 142. For example, if the metal particles 426b are copper particles coated with a different metal, when a total volume of the metal particles 426b is 100, a volume ratio of the coating layer 4280 may be 5 to 50. This is in consideration of electrical conductivity, etc., but the present disclosure is not limited thereto.

If the metal particles 426b use copper particles coated with an organic material or a different metal (e.g., tin) from copper, the particle connection layer 428 may include a first portion and a second portion in which an amount of the first metal is less than that in the first portion.

The solder material including the second metal may be a material that enables soldering. For example, the second metal may be tin (Sn), and the solder material may consist of only the second metal or may be an alloy further including other metal. For example, soldering characteristics may be further improved by using a tin-silver-copper (Sn—Ag—Cu, SAC)-based alloy as a solder material.

The adhesive material may include an organic material, an inorganic material, etc. as a material capable of improving soldering characteristics, and may have non-conductive properties. For example, the adhesive material may be a material including both an organic material and an inorganic material, for example, a flux including carbon, oxide, rosin, etc. The flux may include carbon, oxide, rosin, etc., and serve to improve adhesion characteristics between the connection electrode portion 42b and the wiring portion 140 during soldering. In addition, the flux may include an additive for effective dispersion. However, the present disclosure is not limited thereto, and various materials capable of improving the adhesion characteristics of the wiring member 142 may be used as the adhesive material.

Here, when a total volume of the metal particles, the solder material, and the adhesive material is 100, a volume ratio of the adhesive material is 30 to 70. As described above, a sufficient amount of the adhesive material is included, and may serve as a solder paste improving an adhesive force between the connection electrode portion 42b and the wiring member 142. When a total volume of the metal particles 426b and the solder material is 100, a volume ratio of the metal particles may be 15 to 80, and a volume ratio of the solder material may be 20 to 85. This is limited to a range that can sufficiently implement the roles of the metal particles 426b and the solder material. For example, a volume of the solder material may be equal to or greater than a volume of the metal particles 426b. Hence, the solder material can efficiently implement a role of the solder paste improving the adhesive force between the connection electrode portion 42b and the wiring member 142. However, the present disclosure is not limited thereto. The particle diameter, volume, weight, etc. of the metal particles, the solder material, and the adhesive material may be variously changed.

The paste includes a solvent, but the solvent may become volatile upon the heat treatment. Hence, the solvent may not be included in the connection electrode portions 42b and 44b or a very small amount of the solvent may be included in the connection electrode portions 42b and 44b. An organic solvent may be used as the solvent. For example, butyl carbitol acetate (BCA), cellulose acetate (CA), etc. may be used as the solvent, but the present disclosure is not limited thereto. For example, the paste may further include an additive, a binder, etc.

The paste may be coated on only a portion corresponding to the main electrode portions 42a and 44a. For example, the paste for forming the connection electrode portions 42b and 44b may be coated by screen printing using a mask. However, the present disclosure is not limited thereto.

The paste coated on the main electrode portions 42a and 44a is dried at a first temperature. The first temperature is higher than a room temperature and may be 150° C. or less, but the present disclosure is not limited thereto. The first temperature may have other values. A problem, such as that the paste undesirably flows down, can be prevented by drying the paste. If heat treatment is directly performed without performing the dry step, a problem, such as a crack, may occur due to a temperature difference. Heat treatment for hardening is performed after the fluidity of the paste is reduced by drying the paste at a temperature lower than a heat treatment temperature.

The heat treatment for hardening (annealing heat treatment) is performed on the dried paste at a second temperature that is higher than the first temperature and that is lower than a melting point of the first metal (i.e., a higher melting point of melting points of the first and second metals. In this case, the second temperature may be higher than the melting point of the second metal (i.e., a lower melting point of the melting points of the first and second metals). For example, the second temperature may be 450° C. or less (e.g., 180 to 280° C.). However, the present disclosure is not limited thereto, and the second temperature may have other values. The heat treatment process, as illustrated in FIG. 9f, may be performed by a reflow process performed after the wiring member 142 is positioned on the electrodes 42 and 44. If the heat treatment of the paste for forming the connection electrode portion 42b is performed together in the reflow process, the process can be simplified.

When the heat treatment is performed on the dried paste, the solvent is volatile and heat is applied to the first and second metals. When heat is applied to the first metal and the second metal, the first metal is aggregated with the first metal together, and the second metal is aggregated with the second metal together. In this case, the adhesion characteristics with the connection electrode portions 42b and 44b can be improved by the adhesive material. The adhesive material can also improve the adhesion characteristics with the wiring portion 140.

More specifically, when the metal particles 426b including the first metal and the solder material including the second metal are provided in the heat treatment process, the second metal of the solder material melts and flows out. Hence, the metal particles 426b are aggregated to form the particle connection layer 426, and the molten and flowed-out second metals are aggregated on the outer surface of the particle connection layer 426, thereby forming the cover layer 428 covering the particle connection layer 426. In this case, if the first metal includes copper, copper can effectively deliver heat to the second metal since copper is easily aggregated when heat is applied to copper, and easily absorbs heat. Accordingly, the second metal can move more smoothly to the outer surface of the particle connection layer 426 and can be aggregated together on the outer surface.

In this case, the particles 426b of the particle connection layer 426 are not sintered, but contact with each other and are aggregated to have conductivity by hardening simply. The binder or the second metal may remain between the metal particles 426b of the particle connection layer 426 formed by simple hardening as described above to form remaining portions 428a and 428b. A gap (v in FIG. 1, hereinafter the same) may remain in a part between the metal particles 426b. Hence, the connection electrode portions 42b and 44b may have a higher gap ratio than the main electrode portions 42a and 44a not having the gap v. The main electrode portions 42a and 44a comprised of a sputtering layer and the connection electrode portions 42b and 44b comprised of a printing layer may be identified based on a difference in the gap ratio. For reference, the main electrode portion 42a comprised of the sputtering layer and the connection electrode portion 42b comprised of the printing layer may be identified based on a cross-sectional shape or an external surface shape in a micrograph or may be identified depending on whether a binder is present through component analysis.

In the heat treatment step, an intermetallic compound (IMC) layer 420 (see FIG. 3), in which a metal included in the main electrode portions 42a and 44a and the second metal are mixed, may be formed between the main electrode portions 42a and 44a and the connection electrode portions 42b and 44b.

FIGS. 9a to 9f and the description thereof illustrate that the step of forming the insulating member IP is performed between the step of forming the main electrode portions 42a and 44a and the step of forming the connection electrode portions 42b and 44b, by way of example. However, the present disclosure is not limited thereto. Thus, in an embodiment illustrated in FIG. 12, the step of forming the insulating member IP may be performed between the step of forming the photoelectric conversion unit and the step of forming the electrodes 42 and 44. When the step of forming the insulating member IP is performed before the step of forming the connection electrode portions 42b and 44b as described above, a process of removing an oxide layer of the main electrode portions 42a and 44a (for example, plasma process) may be performed after the step of forming the insulating member IP. Hence, the connection characteristics of the main electrode portions 42a and 44a and the connection electrode portions 42b and 44b can be improved by exposing a portion, in which the connection electrode portions 42b and 44b will be formed, while protecting the main electrode portions 42a and 44a by the insulating member IP.

However, the present disclosure is not limited thereto. For another example, in an embodiment illustrated in FIG. 13, the insulating member IP may be formed after forming the electrodes 42 and 44 including the main electrode portions 42a and 44a and the connection electrode portions 42b and 44b. Various other modifications can be used.

FIGS. 9a to 9f illustrate that in the reflow process performed after the wiring member 142 is positioned on the electrodes 42 and 44, the heat treatment of the paste for forming the connection electrode portions 42b and 44b is performed, by way of example. However, the present disclosure is not limited thereto. The heat treatment for forming the connection electrode portions 42b and 44b may be performed in various steps. For example, before for performing the process of forming the adhesive layer LSP, the process of positioning the wiring member 142, etc., the heat treatment for forming the connection electrode portions 42b and 44b may be immediately performed without another process after coating and drying the paste for forming the connection electrode portions 42b and 44b. Various other modifications can be used.

According to the present embodiment, the connection electrode portion 42b may serve as an electrode for collecting and delivering electric current with a low electrical resistance, and as a solder paste for adhesion to the wiring portion 140 by including the solder material and the adhesive material. Hence, a separate solder paste layer formed corresponding to each overlap portion is not required for the substantial connection of the wiring portion 140 and the electrodes 42 and 44. As a result, the solar cell panel 100 can be manufactured through the simple manufacturing process and can have excellent efficiency and output due to a low resistivity. In particular, in the solar cell 10 having the back electrode structure in which both the first and second electrodes 42 and 44 with different polarities are provided on the back surface, the solar cell panel 100 can efficiently improve the output and greatly simplify the manufacturing process by improving the electrode structure for the attachment to the wiring portion 140.

In particular, in the method of manufacturing the solar cell 10 according to the present embodiment, the connection electrode portions 42b and 44b may be formed by printing the paste including the first metal and the second metal, and thus the electrodes 42 and 44 including the main electrode portions 42a and 44a and the connection electrode portions 42b and 44b may be formed through the simple process. In the present embodiment, the second metal can effectively prevent the oxidization of the first metal at the cover layer 428 that is the outermost layer connected to the wiring portion 140 or the adhesive layer LSP. In the related art, before the wiring portion 140 or the adhesive layer LSP is formed, a plasma process for removing an oxide layer formed in the electrodes 42 and 44 has been additionally performed. However, in the present embodiment, the plasma process for removing the oxide layer can be omitted by preventing oxidization at the outermost layer of the electrodes 42 and 44 using the second metal. Accordingly, the present embodiment can simplify the process and fundamentally prevent a problem such as a damage to the electrodes 42 and 44 or the solar cell 10.

Hereinafter, a solar cell panel according to other modified examples of the present disclosure is described in detail. The detailed description of configurations that are the same as or extremely similar to the above description will be omitted, and only a difference will be described in detail. The combinations of the above-described embodiments or modified examples thereof and the following embodiment or modified embodiments thereof are also within the scope of the present disclosure.

FIG. 11 is a rear plan view and a partial cross-sectional view thereof schematically illustrating two solar cells, an insulating member, and a wiring portion included in a solar cell panel according to another modified example of the present disclosure.

Referring to FIG. 11, in this modified example, in a first electrode 42, a main electrode portion 42a may continuously elongate along the first direction, and a plurality of insulating members IP may be positioned on the main electrode portion 42a to be spaced apart from each other in the first direction. The plurality of insulating members IP may be positioned in an overlap portion of the insulating member IP and a second wiring member 142b. Further, a connection electrode portion 42b may be positioned on the main electrode portion 42a to include a portion, in which the plurality of insulating members IP are not positioned, i.e., a portion overlapping at least a first wiring member 142a. In this instance, the connection electrode portion 42b in the first direction may have a greater length than a portion overlapping the first wiring member 142a, and may contact two adjacent insulating members IP among the plurality of insulating members IP and extend to connect the two adjacent insulating members IP. Hence, this modified example can simplify a process of forming the connection electrode portion 42b by reducing an area of the connection electrode portion 42b and can stably connect the connection electrode portion 42b to the first wiring member 142a while reducing the material cost.

Similar to this, in a second electrode, a main electrode portion may continuously elongate along the first direction, and a plurality of insulating members IP may be positioned on the main electrode portion to be spaced apart from each other in the first direction. The plurality of insulating members IP may be positioned in an overlap portion of the insulating member IP and a first wiring member 142a. Further, a connection electrode portion may be positioned on the main electrode portion to include a portion, in which the plurality of insulating members IP are not positioned, i.e., a portion overlapping at least a second wiring member 142b. In this instance, the connection electrode portion in the first direction may have a greater length than a portion overlapping the second wiring member 142b, and may contact two adjacent insulating members IP among the plurality of insulating members IP and extend to connect the two adjacent insulating members IP. Hence, this modified example can simplify a process of forming the connection electrode portion by reducing an area of the connection electrode portion and can stably connect the connection electrode portion to the first wiring member 142a while reducing the material cost.

FIG. 12 is a rear plan view and a partial cross-sectional view thereof schematically illustrating two solar cells, an insulating member, and a wiring portion included in a solar cell panel according to another modified example of the present disclosure.

Referring to FIG. 12, this modified example may include a plurality of insulating members IP positioned to be spaced apart from each other in the first direction, and main electrode portions 42a and 44a and connection electrode portions 42b and 44b may be positioned between the plurality of insulating members IP. In this instance, the connection electrode portions 42b and 44b may be formed to include entirely an overlap portion of electrodes 42 and 44 and a wiring portion 140 that have to be electrically connected to each other. Hence, the plurality of main electrode portions 42a and 44a and the plurality of connection electrode portions 42b and 44b corresponding to one first electrode 42 or one second electrode 44 may be provided to be spaced apart from each other at a predetermined distance in the first direction.

More specifically, in the first electrode 42, the plurality of insulating members IP may be positioned on a back passivation layer 40 and/or an insulating layer 41 to be spaced apart from each other in the first direction, and the main electrode portion 42a and the connection electrode portion 42b may be positioned between the plurality of insulating members IP. The plurality of insulating members IP may be positioned in an overlap portion of the insulating member IP and the second wiring member 142b. Further, the main electrode portion 42a and the connection electrode portion 42b may be positioned to include a portion, in which the plurality of insulating members IP are not positioned, i.e., a portion overlapping at least the first wiring member 142a. In this instance, the main electrode portion 42a and/or the connection electrode portion 42b in the first direction may have a greater length than a portion overlapping the first wiring member 142a. FIG. 12 illustrates that the main electrode portion 42a and the connection electrode portion 42b contact two adjacent insulating members IP among the plurality of insulating members IP and extend to connect the two adjacent insulating members IP, by way of example. However, the present disclosure is not limited thereto. For example, the main electrode portion 42a and/or the connection electrode portion 42b may be positioned between two adjacent insulating members IP among the plurality of insulating members IP to be spaced apart from the two adjacent insulating members IP. Hence, this modified example can simplify a process of forming the main electrode portion 42a and/or the connection electrode portion 42b and improve the insulation properties by reducing an area of the main electrode portion 42a and/or the connection electrode portion 42b and can stably connect the connection electrode portion 42b to the first wiring member 142a while reducing the material cost.

Similar to this, in the second electrode, the plurality of insulating members IP may be positioned on a back passivation layer 40 and/or an insulating layer 41 to be spaced apart from each other in the first direction, and the main electrode portion and the connection electrode portion may be positioned between the plurality of insulating members IP. The plurality of insulating members IP may be positioned in an overlap portion of the insulating member IP and the first wiring member 142a. Further, the main electrode portion and the connection electrode portion may be positioned to include a portion, in which the plurality of insulating members IP are not positioned, i.e., a portion overlapping at least the second wiring member 142b. In this instance, the main electrode portion and/or the connection electrode portion in the first direction may have a greater length than a portion overlapping the first wiring member 142a. Here, the main electrode portion and the connection electrode portion may contact two adjacent insulating members IP among the plurality of insulating members IP and extend to connect the two adjacent insulating members IP. However, the present disclosure is not limited thereto. For example, the main electrode portion and/or the connection electrode portion may be positioned between two adjacent insulating members IP among the plurality of insulating members IP to be spaced apart from the two adjacent insulating members IP. Hence, this modified example can simplify a process of forming the main electrode portion and/or the connection electrode portion and improve the insulation properties by reducing an area of the main electrode portion and/or the connection electrode portion and can stably connect the connection electrode portion to the second wiring member 142b while reducing the material cost.

FIG. 13 is a rear plan view and a partial cross-sectional view thereof schematically illustrating two solar cells, an insulating member, and a wiring portion included in a solar cell panel according to another modified example of the present disclosure.

Referring to FIG. 13, in a first electrode 42, a main electrode portion 42a and a connection electrode portion 42b may continuously elongate along the first direction, and a plurality of insulating members IP may be positioned on the main electrode portion 42a and the connection electrode portion 42b to be spaced apart from each other in the first direction. The plurality of insulating members IP may be positioned in an overlap portion of the insulating member IP and a second wiring member 142b. Hence, this modified example can stably connect the connection electrode portion 42b to the first wiring member 142a by forming entirely the connection electrode portion 42b.

Similar to this, in a second electrode, a main electrode portion and a connection electrode portion may continuously elongate along the first direction, and a plurality of insulating members IP may be positioned on the main electrode portion and the connection electrode portion to be spaced apart from each other in the first direction. The plurality of insulating members IP may be positioned in an overlap portion of the insulating member IP and a first wiring member 142a. Hence, this modified example can stably connect the connection electrode portion to the second wiring member 142a by forming entirely the connection electrode portion.

The above description is given based on that the first and second electrodes 42 and 44 have the same structure, by way of example. However, the present disclosure is not limited thereto, and the first and second electrodes 42 and 44 may have different structures. FIGS. 11 to 13 illustrate that the adhesive layer LSP is provided in the same manner as FIG. 7, by way of example. However, the present disclosure is not limited thereto. Thus, the adhesive layer LSP may not be provided in the same manner as FIG. 8, and various other modifications can be used.

Hereinafter, a solar cell panel and a method for manufacturing the same according to other embodiments of the present disclosure are described in detail. The detailed description of configurations that are the same as or extremely similar to the above description will be omitted, and only a difference will be described in detail. The combinations of the above-described embodiments or modified examples thereof and the following embodiment or modified embodiments thereof are also within the scope of the present disclosure.

FIG. 14 is a rear plan view and a partial cross-sectional view thereof schematically illustrating two solar cells, an insulating member, and a wiring portion included in a solar cell panel according to another embodiment of the present disclosure.

Referring to FIG. 14, in the present embodiment, in a first electrode 42, a main electrode portion 42a may continuously elongate along the first direction, and a plurality of insulating members IP may be positioned on the main electrode portion 42a to be spaced apart from each other in the first direction. The plurality of insulating members IP may be positioned in an overlap portion of the insulating member IP and a second wiring member 142b. Further, connection electrode portions 42b and 42c may be positioned on the main electrode portion 42a to include a portion, in which the plurality of insulating members IP are not positioned, i.e., a portion overlapping at least a first wiring member 142a. In this instance, the connection electrode portions 42b and 42c in the first direction may have a greater length than a portion overlapping the first wiring member 142a, and may contact two adjacent insulating members IP among the plurality of insulating members IP and extend to connect the two adjacent insulating members IP. Hence, the present embodiment can simplify a process of forming the connection electrode portions 42b and 42c by reducing an area of the connection electrode portions 42b and 42c and can stably connect the connection electrode portions 42b and 42c to the first wiring member 142a while reducing the material cost.

In this instance, the connection electrode portions 42b and 42c of the first electrode 42 include a first connection electrode portion 42b formed corresponding to a portion in which the first wiring member 142a is to be positioned, and a second connection electrode portion 42c including a different material from the first connection electrode portion 42b. For example, the first connection electrode portion 42b may be formed to include a portion of the first electrode 42 in which the first wiring member 142a is to be positioned, and the second connection electrode portion 42c may be extended to connect the first connection electrode portion 42b and the insulating member IP in the first electrode 42. Hence, the connection electrode portions 42b and 42c including the first and second connection electrode portions 42b and 42c may be extended to connect at least the plurality of insulating members IP, and the connection electrode portions 42b and 42c may be entirely positioned on the portion in which the plurality of insulating members IP are not positioned.

Here, the first connection electrode portion 42b may include the first metal, the solder material including the second metal, and the adhesive material in the same manner as the connection electrode portion 42*b* according to the above-described embodiment. That is, the description of the connection electrode portion 42*b* according to the above-described embodiment can be applied to the first connection electrode portion 42*b* according to the present embodiment as it is. Hence, a detailed description of the first connection electrode portion 42*b* is omitted.

The second connection electrode portion 42*c* may include the first metal, the solder material including the second metal, and a binder. The first metal, the second metal, and the solder material including the second metal may be the same as or extremely similar to the connection electrode portion 42*c* according to the above-described embodiment, and thus a detailed description thereof is omitted. The binder may include a resin consisting of a non-conductive organic material. For example, the binder may include ethyl cellulose binder. The binder can improve adhesion characteristics with the main electrode portion 42*a*.

In the present embodiment, an adhesive force between the first connection electrode portion 42*b* and the first wiring member 142*a* may be greater than an adhesive force between the second connection electrode portion 42*c* and the first wiring member 142*a*. This is because the first connection electrode portion 42*b* includes an adhesive material capable of improving soldering characteristics with the first wiring member 142*a*, and the second connection electrode portion 42*c* includes the binder considering only the attachment to the main electrode portion 42*a*.

A resistivity of the second connection electrode portion 42*c* may be less than a resistivity of the first connection electrode portion 42*b*. For example, an amount of the first metal included in the first connection electrode portion 42*b* may be less than an amount of the first metal included in the second connection electrode portion 42*c*. The present embodiment can improve the efficiency of the solar cell 10 and the output of the solar cell panel 100 by disposing the second connection electrode portion 42*c* in a portion, that does not directly contact the first wiring member 142*a* as described above, to thereby reduce the resistance of the first electrode 42.

Similar to this, in a second electrode 44, a main electrode portion 44*a* may continuously elongate along the first direction, and a plurality of insulating members IP may be positioned on the main electrode portion 44*a* to be spaced apart from each other in the first direction. The plurality of insulating members IP may be positioned in an overlap portion of the insulating member IP and a first wiring member 142*a*. Further, connection electrode portions 44*b* and 44*c* may be positioned on the main electrode portion 44*a* to include a portion, in which the plurality of insulating members IP are not positioned, i.e., a portion overlapping at least a second wiring member 142*b*. In this instance, the connection electrode portions 44*b* and 44*c* in the first direction may have a greater length than a portion overlapping the second wiring member 142*b*, and may contact two adjacent insulating members IP among the plurality of insulating members IP and extend to connect the two adjacent insulating members IP. Hence, the present embodiment can simplify a process of forming the connection electrode portions 44*b* and 44*c* by reducing an area of the connection electrode portions 44*b* and 44*c* and can stably connect the connection electrode portions 44*b* and 44*c* to the second wiring member 142*b* while reducing the material cost.

In this instance, the connection electrode portions 44*b* and 44*c* of the second electrode 44 include a first connection electrode portion 44*b* formed corresponding to a portion in which the second wiring member 142*b* is to be positioned, and a second connection electrode portion 44*c* including a different material from the first connection electrode portion 44*b*. For example, the first connection electrode portion 44*b* may be formed to include a portion of the second electrode 44 in which the second wiring members 142*b* is to be positioned, and the second connection electrode portion 44*c* may be extended to connect the first connection electrode portion 44*b* and the insulating member IP in the first electrode 42. Hence, the connection electrode portions 44*b* and 44*c* including the first and second connection electrode portions 44*b* and 44*c* may be extended to connect at least the plurality of insulating members IP, and the connection electrode portions 44*b* and 44*c* may be entirely positioned on the portion in which the plurality of insulating members IP are not positioned.

Here, the first connection electrode portion 44*b* may include the first metal, the solder material including the second metal, and the adhesive material, and the second connection electrode portion 44*c* may include the first metal, the solder material including the second metal, and a binder. The description of the first and second connection electrode portions 42*b* and 42*c* of the first electrode 42 can be applied to the first and second connection electrode portions 44*b* and 44*c* of the second electrode 44, as it is, and thus a detailed description thereof is omitted.

In the present embodiment, an adhesive force between the first connection electrode portion 44*b* and the second wiring member 142*b* may be greater than an adhesive force between the second connection electrode portion 44*c* and the second wiring member 142*b*. Further, a resistivity of the second connection electrode portion 44*c* may be less than a resistivity of the first connection electrode portion 44*b*. For example, an amount of the first metal included in the first connection electrode portion 44*b* may be less than an amount of the first metal included in the second connection electrode portion 44*c*. The present embodiment can improve the efficiency of the solar cell 10 and the output of the solar cell panel 100 by disposing the second connection electrode portion 44*c* in a portion, that does not directly contact the second wiring member 142*b* as described above, to thereby reduce the resistance of the second electrode 44.

FIG. 14 illustrates that the insulating members IP are positioned on the main electrode portions 42*a* and 44*a*, and the connection electrode portions 42*b* and 42*c* and 44*b* and 44*c* are positioned on the main electrode portions 42*a* and 44*a* and between the insulating members IP, by way of example. However, the present disclosure is not limited thereto.

As a modified example, as illustrated in FIG. 15, the insulating members IP may be positioned on the main electrode portions 42*a* and 44*a* and the connection electrode portions 42*b* and 42*c* and 44*b* and 44*c*. In this case, the second connection electrode portions 42*c* and 44*c* may be formed to be connected to the neighboring first connection electrode portions 42*b* and 44*b* by passing the lower part of the insulating members IP. Hence, the connection electrode portions 42*b* and 42*c* and 44*b* and 44*c* including the first and second connection electrode portions 42*b* and 42*c* and 44*b* and 44*c* may be positioned entirely in the first and second electrodes 42 and 44.

As another modified example, the insulating members IP may be positioned to be spaced apart from each other at a predetermined distance in the first direction, and the main electrode portions 42*a* and 44*a* and the connection electrode portions 42*b* and 42*c* and 44*b* and 44*c* may be extended to connect at least the plurality of insulating members IP. Hence, the connection electrode portions 44*b* and 44*c* may be positioned entirely in a portion in which the plurality of insulating members IP are not positioned.

The above description is given based on that the first and second electrodes 42 and 44 have the same structure, by way of example. However, the present disclosure is not limited thereto, and the first and second electrodes 42 and 44 may have different structures. FIGS. 14 and 15 illustrate that the adhesive layer LSP is provided in the same manner as FIG. 7, by way of example. However, the present disclosure is not limited thereto. Thus, the adhesive layer LSP may not be provided in the same manner as FIG. 8, and various other modifications can be used.

In addition, the embodiments described above are given based on the solar cell 10 with the back electrode structure, but the present disclosure is not limited thereto. Hence, even in a solar cell in which the first and second electrodes 42 and 44 are positioned on the opposite surfaces, at least one of the first and second electrodes 42 and 44 may have the above-described structure. In this instance, the wiring member 142 may be directly connected to the connection electrode portions 42b and 44b, or may be connected to the connection electrode portions 42b and 44b by the adhesive layer LSP (e.g., low temperature solder paste) and may be connected to the connection electrode portions 42b and 44b without a separate solder paste layer (e.g., high temperature solder paste). Various other modifications can be used.

The features, structures, effects and the like according to the above-described embodiments are included in at least one embodiment of the present disclosure, and are not necessarily limited to only one embodiment. Furthermore, the features, structures, effects, and the like illustrated in the embodiments may be combined or modified in other embodiments by those skilled in the art to which the embodiments belong. Accordingly, contents related to these combinations and modifications should be construed as being included in the scope of the present disclosure.

The invention claimed is:

1. A solar cell panel comprising:
a solar cell including a semiconductor substrate, a plurality of first and second conductivity type regions positioned in the semiconductor substrate or on the semiconductor substrate, and a plurality of first and second electrodes electrically connected to the plurality of first and second conductivity type regions and extended in a first direction;
a wiring portion including a plurality of first wiring members electrically connected to the plurality of first electrodes and extended in a second direction intersecting the first direction, and a plurality of second wiring members electrically connected to the plurality of second electrodes and extended in the second direction;
a plurality of insulating members positioned in overlap portions of the plurality of first electrodes and the plurality of second wiring members and overlap portions of the plurality of second electrodes and the plurality of first wiring members;
a sealing member surrounding the solar cell, the plurality of insulating members, and the wiring portion;
a first cover member positioned on the sealing member and on one surface of the solar cell; and
a second cover member positioned on the sealing member and on other surface of the solar cell,
wherein at least one of the first and second electrodes includes a main electrode portion and a connection electrode portion positioned on the main electrode portion, with an intermetallic compound (IMC) layer sandwiched between the main electrode portion and the connection electrode portion in which a metal included in the main electrode portion and a second metal included in the connection electrode portion are mixed, the intermetallic compound layer is a compound layer in which a nickel-vanadium (Ni—V) alloy and tin (Sn) are mixed, the main electrode portion has a lamination structure, and extended in the first direction, the intermetallic compound layer is directly in contact with the main electrode portion and the connection electrode portion, and the intermetallic compound layer has a thickness ranging from 20 nm to 500 nm,
wherein the connection electrode portion includes a particle connection layer formed by connecting a plurality of particles including a first metal, and a cover layer that includes the second metal different from the first metal and covers at least an outer surface of the particle connection layer, and
wherein the plurality of particles each have a substantially spherical shape, and the outer surface of the particle connection layer has a shape of a curved surface having a plurality of concave parts corresponding to the substantially spherical shape.

2. The solar cell panel of claim 1, wherein the connection electrode portion is extended to connect at least the plurality of insulating members in the first electrode or the second electrode.

3. The solar cell panel of claim 1, wherein the wiring portion is directly connected to the cover layer, or a solder paste is directly positioned on the cover layer.

4. The solar cell panel of claim 1, the plurality of first and second electrodes are provided in the second direction, and a number of the plurality of first and second electrodes is 100 or more, and
wherein a thickness of the connection electrode portion is equal to or greater than 10 μm.

5. The solar cell panel of claim 1, wherein the connection electrode portion in at least one of the first and second electrodes is comprised of a first connection electrode portion further including a solder material including the second metal and an adhesive material.

6. The solar cell panel of claim 1, wherein the connection electrode portion in at least one of the first and second electrodes includes a first connection electrode portion formed corresponding to a portion in which the first wiring member or the second wiring member is to be positioned, and a second connection electrode portion including a different material from the first connection electrode portion.

7. The solar cell panel of claim 6, wherein the first connection electrode portion includes the first metal, a solder material including the second metal, and an adhesive material, and
wherein the second connection electrode portion includes the second metal, the solder material including the second metal, and a binder including a resin.

8. The solar cell panel of claim 6, wherein an adhesive force between the first connection electrode portion and the first wiring member or the second wiring member is greater than an adhesive force between the second connection electrode portion and the first wiring member or the second wiring member.

9. The solar cell panel of claim 6, wherein a resistivity of the second connection electrode portion is less than a resistivity of the first connection electrode portion.

10. The solar cell panel of claim 6, wherein an amount of the first metal included in the first connection electrode portion is less than an amount of the first metal included in the second connection electrode portion.

11. The solar cell panel of claim 1, wherein the main electrode portion elongates along the first direction,
wherein the plurality of insulating members are positioned on the main electrode portion and are spaced apart from each other in the first direction, and
wherein the connection electrode portion contacts two adjacent insulating members among the plurality of insulating members in the first direction and is extended to connect the two adjacent insulating members.

12. The solar cell panel of claim 1, wherein the first and second electrodes elongate along the first direction,
wherein the plurality of insulating members are spaced apart from each other in the first direction, and
wherein the main electrode portion and the connection electrode portion contact two adjacent insulating members among the plurality of insulating members in the first direction and are extended to connect the two adjacent insulating members.

13. The solar cell panel of claim 1, wherein the first metal has a resistivity that is equal to or less than a resistivity of a material of the main electrode portion or the second electrode, and
wherein the second metal includes tin (Sn).

14. The solar cell panel of claim 13, wherein the first metal includes copper.

15. The solar cell panel of claim 1, wherein the first metal includes copper, and
wherein the second metal includes tin (Sn).

16. The solar cell panel of claim 1, wherein the plurality of particles have an average particle diameter of 2 μm or more.

17. The solar cell panel of claim 1, wherein the plurality of particles are physically and electrically connected by a direct contact or physically and electrically connected through the cover layer.

18. A solar cell panel comprising:
a plurality of solar cells each including a semiconductor substrate, a conductivity type region positioned in the semiconductor substrate or on the semiconductor substrate, and an electrode electrically connected to the conductivity type region; and
a wiring portion electrically connected to the electrode of each solar cell and configured to connect in series the plurality of solar cells,
wherein the electrode in each solar cell includes a main electrode portion comprised of a plurality of electrode layers formed by a deposition, and a connection electrode portion that is positioned on the main electrode portion and is formed by printing a metal electrode paste including a solder material, with an intermetallic compound (IMC) layer sandwiched between the main electrode portion and the connection electrode portion in which a metal included in the main electrode portion and a second metal included in the connection electrode portion are mixed, and the intermetallic compound layer is a compound layer in which a nickel-vanadium (Ni—V) alloy and tin (Sn) are mixed, the main electrode portion has a lamination structure, and extended in a first direction, the intermetallic compound layer is directly in contact with the main electrode portion and the connection electrode portion, and the intermetallic compound layer has a thickness ranging from 20 nm to 500 nm;
wherein the wiring portion is directly connected to the connection electrode portion or is electrically connected to the connection electrode portion by a solder paste,
the connection electrode portion includes a particle connection layer formed by connecting a plurality of particles including a first metal, and a cover layer that includes the second metal different from the first metal and covers at least an outer surface of the particle connection layer, and
wherein the plurality of particles each have a substantially spherical shape, and the outer surface of the particle connection layer has a shape of a curved surface having a plurality of concave parts corresponding to the substantially spherical shape.

19. A solar cell comprising:
a semiconductor substrate;
a conductivity type region positioned in the semiconductor substrate or on the semiconductor substrate; and
an electrode electrically connected to the conductivity type region,
wherein the electrode includes a main electrode portion and a connection electrode portion positioned on the main electrode portion, with an intermetallic compound (IMC) layer sandwiched between the main electrode portion and the connection electrode portion in which a metal included in the main electrode portion and a second metal included in the connection electrode portion are mixed, and the intermetallic compound layer is a compound layer in which a nickel-vanadium (Ni—V) alloy and tin (Sn) are mixed, the main electrode portion has a lamination structure, and extended in a first direction, the intermetallic compound layer is directly in contact with the main electrode portion and the connection electrode portion, and the intermetallic compound layer has a thickness ranging from 20 nm to 500 nm,
wherein the connection electrode portion includes a particle connection layer formed by connecting a plurality of particles including a first metal, and a cover layer that includes the second metal different from the first metal and covers at least an outer surface of the particle connection layer, wherein the particle connection layer incudes a first portion and a second portion in which an amount of the first metal is less than that in the first portion, and
wherein the plurality of particles each have a substantially spherical shape, and the outer surface of the particle connection layer has a shape of a curved surface having a plurality of concave parts corresponding to the substantially spherical shape.

* * * * *